(12) United States Patent
Yang et al.

(10) Patent No.: US 12,503,769 B2
(45) Date of Patent: Dec. 23, 2025

(54) SEMICONDUCTOR PROCESSING TOOL AND METHODS OF OPERATION

(71) Applicant: Taiwan Semiconductor Manufacturing Company, Ltd., Hsinchu (TW)

(72) Inventors: Che Wei Yang, New Taipei (TW); Chih Cheng Shih, Kaohsiung (TW); Kuo Liang Lu, Hsinchu (TW); Yu Jiang, Taipei (TW); Sheng-Chan Li, Tainan (TW); Kuo-Ming Wu, Zhubei (TW); Sheng-Chau Chen, Tainan (TW); Chung-Yi Yu, Hsin-Chu (TW); Cheng-Yuan Tsai, Chu-Pei (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 423 days.

(21) Appl. No.: 18/166,196

(22) Filed: Feb. 8, 2023

(65) Prior Publication Data
US 2024/0084455 A1 Mar. 14, 2024

Related U.S. Application Data

(60) Provisional application No. 63/375,471, filed on Sep. 13, 2022.

(51) Int. Cl.
  *C23C 16/50* (2006.01)
  *C23C 16/40* (2006.01)
  (Continued)

(52) U.S. Cl.
  CPC .......... *C23C 16/50* (2013.01); *C23C 16/405* (2013.01); *C23C 16/56* (2013.01);
  (Continued)

(58) Field of Classification Search
  CPC ........ C23C 16/50; C23C 16/405; C23C 16/56
  See application file for complete search history.

(56) References Cited

U.S. PATENT DOCUMENTS

| | | | | | |
|---|---|---|---|---|---|
| 7,948,095 | B2 * | 5/2011 | Ng | ........................ | H01L 21/561 |
| | | | | | 257/777 |
| 8,043,981 | B2 * | 10/2011 | Ma | ..................... | H01L 21/28211 |
| | | | | | 438/770 |

(Continued)

FOREIGN PATENT DOCUMENTS

| | | | | | |
|---|---|---|---|---|---|
| FR | 2773417 | * | 5/1999 | ............. | H01L 21/28 |
| JP | 2010-11030 | * | 1/2010 | ............. | H01P 1/203 |

(Continued)

OTHER PUBLICATIONS

Li, Sijia, et al., "Influences of semiconductor oxide fillers on the corrosion behavior of metals under coatings". Electrochimica Acta 292 (2018) 425-434.*

*Primary Examiner* — Bret P Chen
(74) *Attorney, Agent, or Firm* — Harrity & Harrity, LLP

(57) ABSTRACT

Some implementations described herein include systems and techniques for fabricating a wafer-on-wafer product using a filled lateral gap between beveled regions of wafers included in a stacked-wafer assembly and along a perimeter region of the stacked-wafer assembly. The systems and techniques include a deposition tool having an electrode with a protrusion that enhances an electromagnetic field along the perimeter region of the stacked-wafer assembly during a deposition operation performed by the deposition tool. Relative to an electromagnetic field generated by a deposition tool not including the electrode with the protrusion, the enhanced electromagnetic field improves the deposition operation so that a supporting fill material may be sufficiently deposited.

20 Claims, 16 Drawing Sheets

(51) Int. Cl.
*C23C 16/56* (2006.01)
*H01J 37/32* (2006.01)

(52) U.S. Cl.
CPC .. *H01J 37/32541* (2013.01); *H01J 37/32568* (2013.01); *H01J 2237/3321* (2013.01)

(56) References Cited

U.S. PATENT DOCUMENTS

| | | | | |
|---|---|---|---|---|
| 8,546,270 | B2* | 10/2013 | Kim | H01L 21/30 |
| | | | | 438/758 |
| 8,936,983 | B2* | 1/2015 | Lee | H10B 41/41 |
| | | | | 438/257 |
| 2002/0090778 | A1* | 7/2002 | Kim | H10D 1/716 |
| | | | | 257/E21.019 |
| 2009/0083977 | A1* | 4/2009 | Hanke | H01L 21/76898 |
| | | | | 29/852 |
| 2012/0007253 | A1* | 1/2012 | Yang | H01L 23/535 |
| | | | | 257/774 |
| 2013/0043539 | A1* | 2/2013 | Chang | H10D 84/0186 |
| | | | | 257/E21.409 |
| 2014/0027932 | A1* | 1/2014 | Brunschwiler | H01L 23/295 |
| | | | | 257/787 |
| 2025/0201784 | A1* | 6/2025 | Lee | H01L 25/50 |

FOREIGN PATENT DOCUMENTS

| | | | | | |
|---|---|---|---|---|---|
| WO | WO 00/02258 | * | 1/2000 | | H01L 31/05 |
| WO | WO 2010088348 | A2 * | 8/2010 | | H01L 21/31 |

* cited by examiner

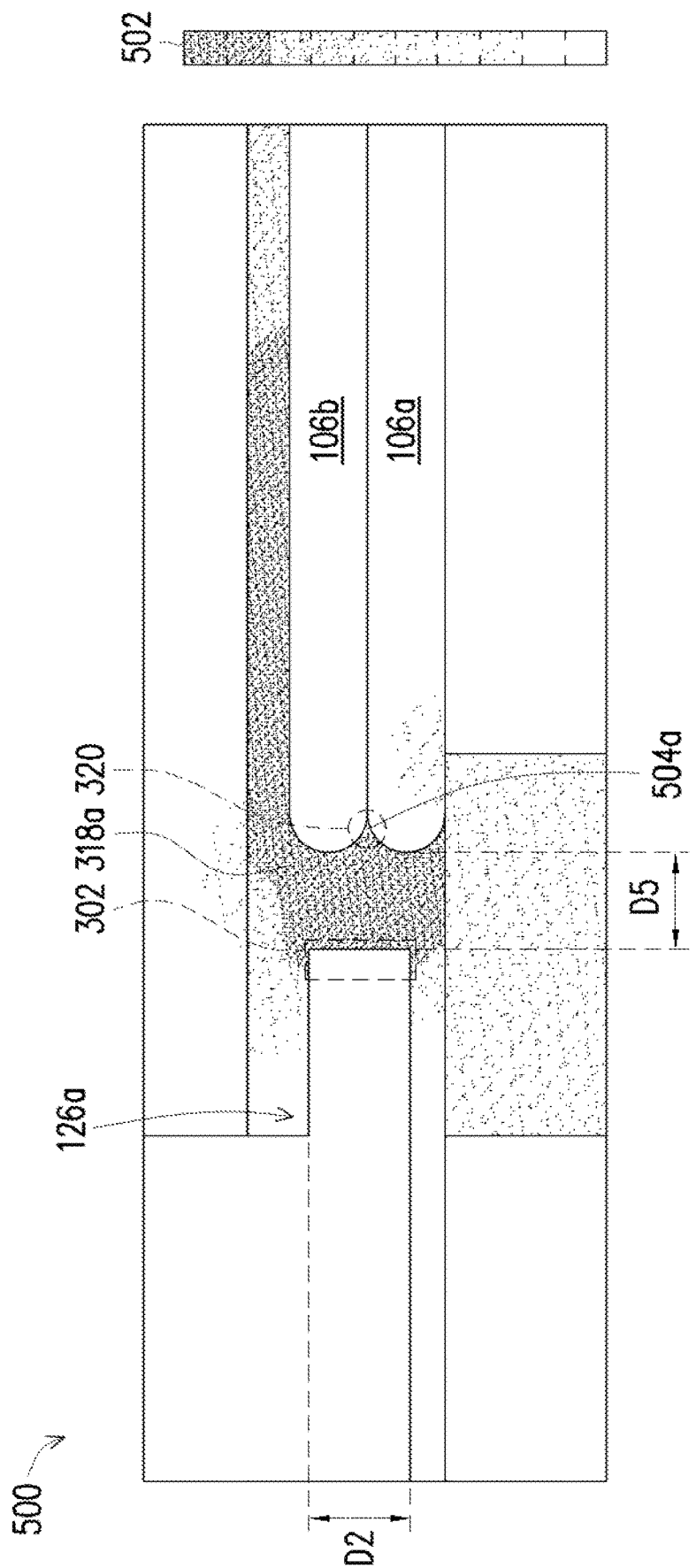

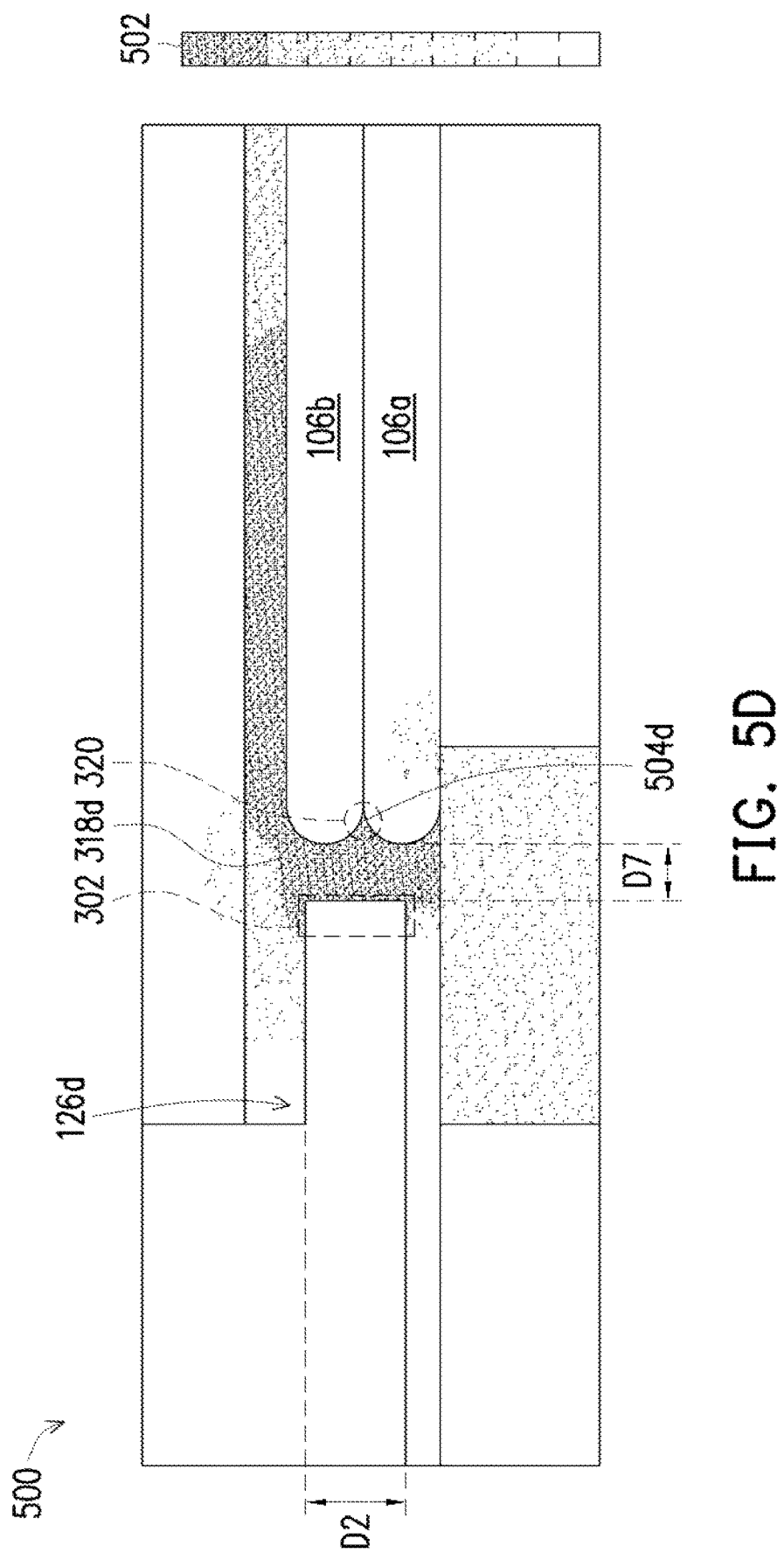

SEMICONDUCTOR PROCESSING TOOL AND METHODS OF OPERATION

CROSS-REFERENCE TO RELATED APPLICATION

This Patent Application claims priority to Provisional Patent Application No. 63/375,471 filed on Sep. 13, 2022, and entitled "Semiconductor Processing Tool and Methods of Operation." The disclosure of the prior application is considered part of and is incorporated by reference into this Patent Application.

BACKGROUND

Chemical vapor deposition (CVD) is a chemical process used in the semiconductor industry to produce thin films. In CVD, a semiconductor wafer (substrate) is exposed to one or more volatile precursors, which react and/or decompose on the substrate surface to produce the thin film. As the geometries of features on the semiconductor wafer are reduced, more complex CVD processes may be required to obtain operational circuits at the reduced feature size. The complex CVD processes may rely on processes performed in vacuums and with tools that may also be more complex and compact.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 5A-5E is a diagram of example electromagnetic fields generated by the deposition tool described herein.

DETAILED DESCRIPTION

Figure 1A:
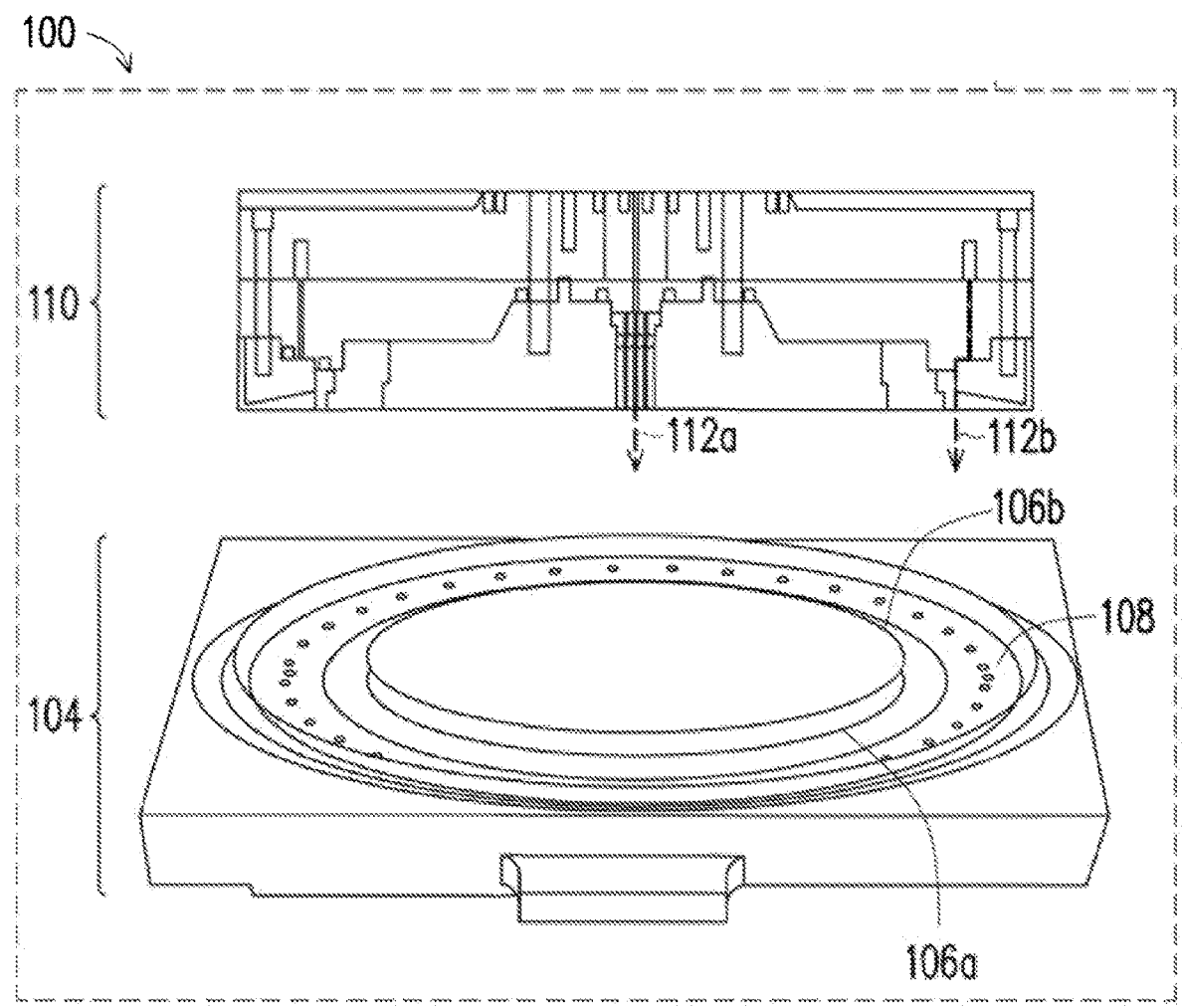
FIGS. 1A-1D are diagrams of an example implementation of components of a deposition tool described herein.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some cases, a partially completed stacked-wafer assembly used in a wafer-on-wafer (WoW) product may include a lateral gap between beveled edges of wafers in the stacked-wafer assembly along a perimeter region of the stacked-wafer assembly.

Due to the presence of the lateral gap, a mechanical robustness of the perimeter region may be such that a multi-step manufacturing process (e.g., a process including a trimming operation, a grinding operation, and an amorphous silicon (a-Si) capping operation) is implemented to avoid damage to the stacked-wafer assembly during an operation that thins the stacked-wafer assembly. In addition to causing inefficiencies in the overall manufacturing of the stacked-wafer assembly (e.g., a use of additional manufacturing tools and/or computing resources, among other examples), the multi-step manufacturing process may increase a likelihood of defects and/or yield loss within the stacked-wafer assembly due to trim-loss, trim wall exposure, and trim peeling that is inherent to the trimming operation.

Some implementations described herein include systems and techniques for fabricating a WoW product using a filled lateral gap between beveled regions of wafers included in a stacked-wafer assembly and along a perimeter region of the stacked-wafer assembly. The systems and techniques include a deposition tool having an electrode with a protrusion that enhances an electromagnetic field along the perimeter region of the stacked-wafer assembly during a deposition operation performed by the deposition tool. Relative to an electromagnetic field generated by a deposition tool not including the electrode with the protrusion, the enhanced electromagnetic field improves the deposition operation so that a supporting fill material may be sufficiently deposited between the beveled regions to improve a robustness of the stacked-wafer assembly.

In this way, the supporting fill material enables a WoW product to be formed with fewer manufacturing steps and/or fewer defects relative to a similar product that is formed using techniques that do not include using the supporting fill material. As such, an increase in manufacturing efficiencies may be realized through a reduction in resources needed to fabricate a volume of the WoW product (e.g., a reduction in manufacturing tools, a reduction in computing resources, and/or a reduction in materials consumed, among other examples). Additionally, or alternatively, a likelihood of defects that reduce a yield during manufacturing and/or cause latent failures of the WoW product during field use may be reduced to improve an overall quality and/or reliability of the WoW product.

FIGS. 1A-1D are diagrams of an example implementation 100 of components of a deposition tool 102 described herein. The deposition tool 102 is a semiconductor processing tool that is capable of depositing various types of materials onto a semiconductor substrate (e.g., a wafer, among other examples). In some implementations, the deposition tool 102 includes a chemical vapor deposition (CVD) tool such as a plasma-enhanced CVD (PECVD) tool, a high-density plasma CVD (HDP-CVD) tool, a sub-atmospheric CVD (SACVD) tool, an atomic layer deposition (ALD) tool, a plasma-enhanced atomic layer deposition (PEALD) tool, or another type of CVD tool.

As shown in FIG. 1A, the deposition tool 102 may include a pumping plate component 104. In a wafer-on-wafer (WoW) process, two or more semiconductor substrates 106 (e.g., the semiconductor substrate 106a and the semiconductor substrate 106b) may be stacked and positioned within a deposition chamber including the pumping plate component 104. The pumping plate component 104 may include one or more vacuum ports 108 surrounding a perimeter of the two or more semiconductor substrates 106.

Further, and as shown in FIG. 1A, the deposition tool 102 includes a gas delivery component 110. As part of a plasma-based, chemical vapor deposition (CVD) process, the gas delivery component 110 may disperse a gas into the deposition chamber of the deposition tool 102 using a combination of gas flows. For example, as shown in FIG. 1A, the gas delivery component 110 may disperse the gas using a central gas flow 112a through a central dispersion port and a perimeter gas flow 112b through one or more perimeter dispersion ports above the two or more semiconductor substrates 106. As part of the CVD deposition process, the central gas flow 112a and the perimeter gas flow 112b may mix within the deposition chamber, be energized into a plasma, flow over the stack of semiconductor substrates 106, and be drawn through the one or more vacuum ports 108 of the pumping plate component 104.

In some implementations, the deposition tool 102 may form (e.g., deposit) a material in a gap between beveled edges of the semiconductor substrate 106a and the semiconductor substrate 106b. As described in greater detail in connection with FIGS. 4A-4C, the deposited material (e.g., a supporting fill material) may increase a robustness of the two or more semiconductor substrates 106 during a thinning operation. Examples of the deposited material include a silicon oxide ($SiO_x$) material, a silicon nitride ($SiN_y$) material, a silicon carbide ($SiC_z$) material, an amorphous silicon (a-Si) material, a metal oxide material, and/or a metal nitride material, among other examples.

Figure 1B:
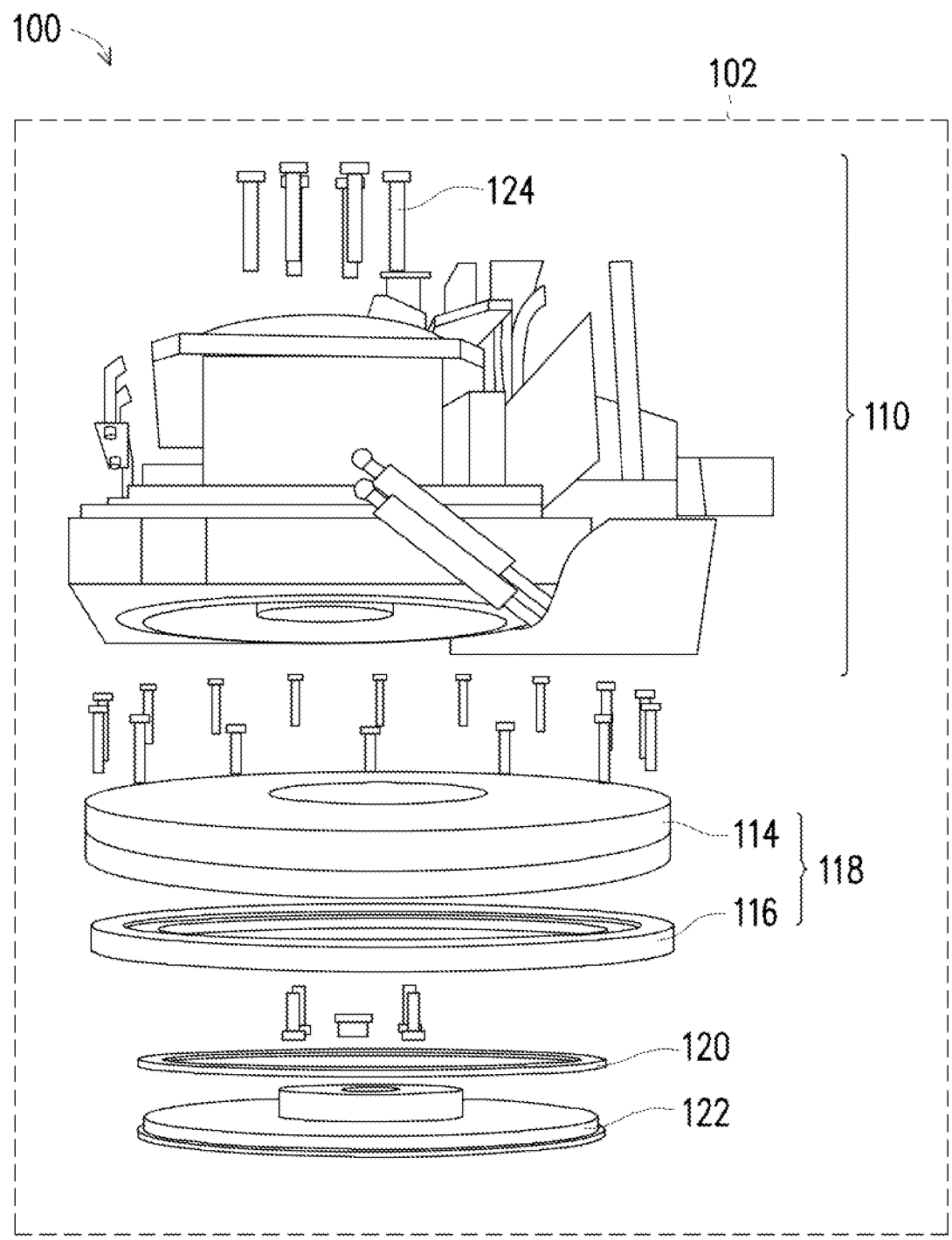

FIG. 1B shows additional components of the deposition tool 102. In addition to the gas delivery component 110, FIG. 1B shows a top electrode 114 and an extension component 116, which may combine to form an electrode component 118 that is used to generate an electromagnetic field that disperses the plasma during the CVD deposition process. In some implementations, the top electrode 114 corresponds to a disc-shaped component that performs as an electrical ground of an electromagnetic circuit (e.g., a disc-shaped ground component).

The deposition tool 102 may further include a plasma-exclusion zone (PEZ) ring component 120 (e.g., a component that shields the plasma from other components within the deposition chamber) and an insulator component 122. The insulator component 122 may electrically isolate the PEZ ring component 120 from one or more electrically conductive components of the deposition tool 102. Further, and as shown in FIG. 1B, the deposition tool 102 may include one or more fasteners 124 (e.g., threaded screws, alignment pins, or rivets, among other examples) to couple one or more components together.

Figure 1C:
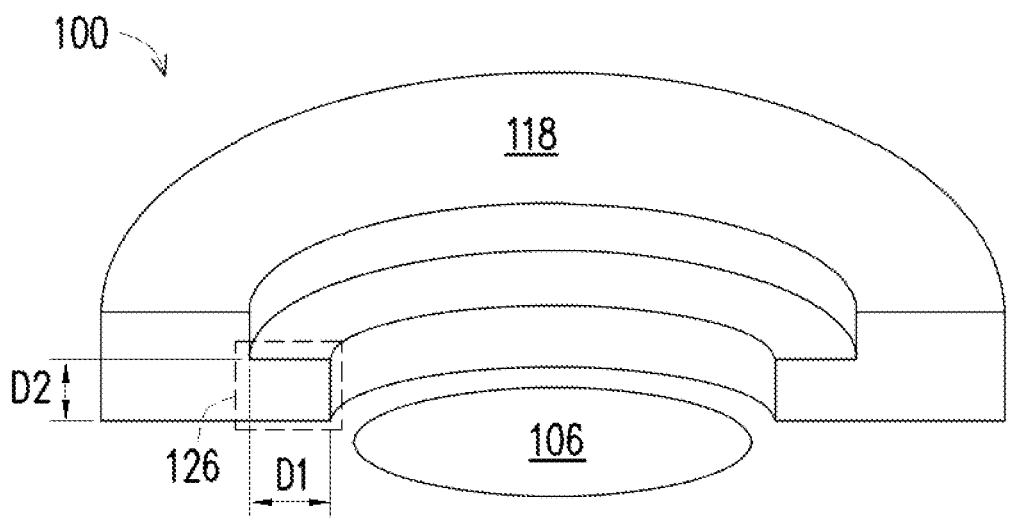

FIG. 1C shows details of the electrode component 118. In some implementations, and as described in greater detail in connection with FIGS. 2A-8 and elsewhere herein, the electrode component 118 includes a protrusion 126. The protrusion 126 may extend from an inner radius of the electrode component 118 towards the stack of semiconductor substrates 106 (e.g., extend radially towards a central location associated the semiconductor substrate 106a and the semiconductor substrate 106b). In other words, the protrusion 126 may correspond to a ring-shaped electrode component.

The protrusion 126 is configured to generate an approximately lateral electromagnetic field between the protrusion 126 and the stack of semiconductor substrates 106 (e.g., between a tip of the protrusion 126 and a lateral gap separating beveled edges of the semiconductor substrate 106a and the semiconductor substrate 106b, among other examples) positioned on a support component The protrusion 126 may include one or more dimensional properties. For example, and in some implementations, the protrusion 126 extends from the inner radius of the electrode component 118 a distance D1 that is included in a range of approximately 1.8 millimeters to approximately 2.2 millimeters. If D1 is greater than approximately 2.2 millimeters, a mechanical interference between the protrusion 126 and a WoW product (e.g., the semiconductor substrate 106b on the semiconductor substrate 106a) may occur. If D1 is less than approximately 1.8 millimeters, an electromagnetic field generated by the protrusion 126 may be insufficient to generate and/or disperse a plasma between beveled edges of the WoW product (e.g., between beveled edges of the semiconductor substrate 106b on the semiconductor substrate 106a). However, other values and ranges for the distance D1 are within the scope of the present disclosure.

Additionally, or alternatively, the protrusion 126 may have a thickness D2 that is included in a range of approximately 0.9 millimeters to approximately 1.1 millimeters. If D2 is greater than approximately 1.1 millimeters, a mechanical interference between the protrusion 126 and a component within a deposition chamber of a deposition tool (e.g., a deposition chamber of the deposition tool 102) may occur. If D2 is less than approximately 0.9 millimeters, an electromagnetic field generated by the protrusion 126 may be insufficient to generate and/or disperse a plasma between beveled edges of the WoW product (e.g., between beveled edges of the semiconductor substrate 106b on the semiconductor substrate 106a). However, other values and ranges for the thickness D2 are within the scope of the present disclosure.

Figure 1D:
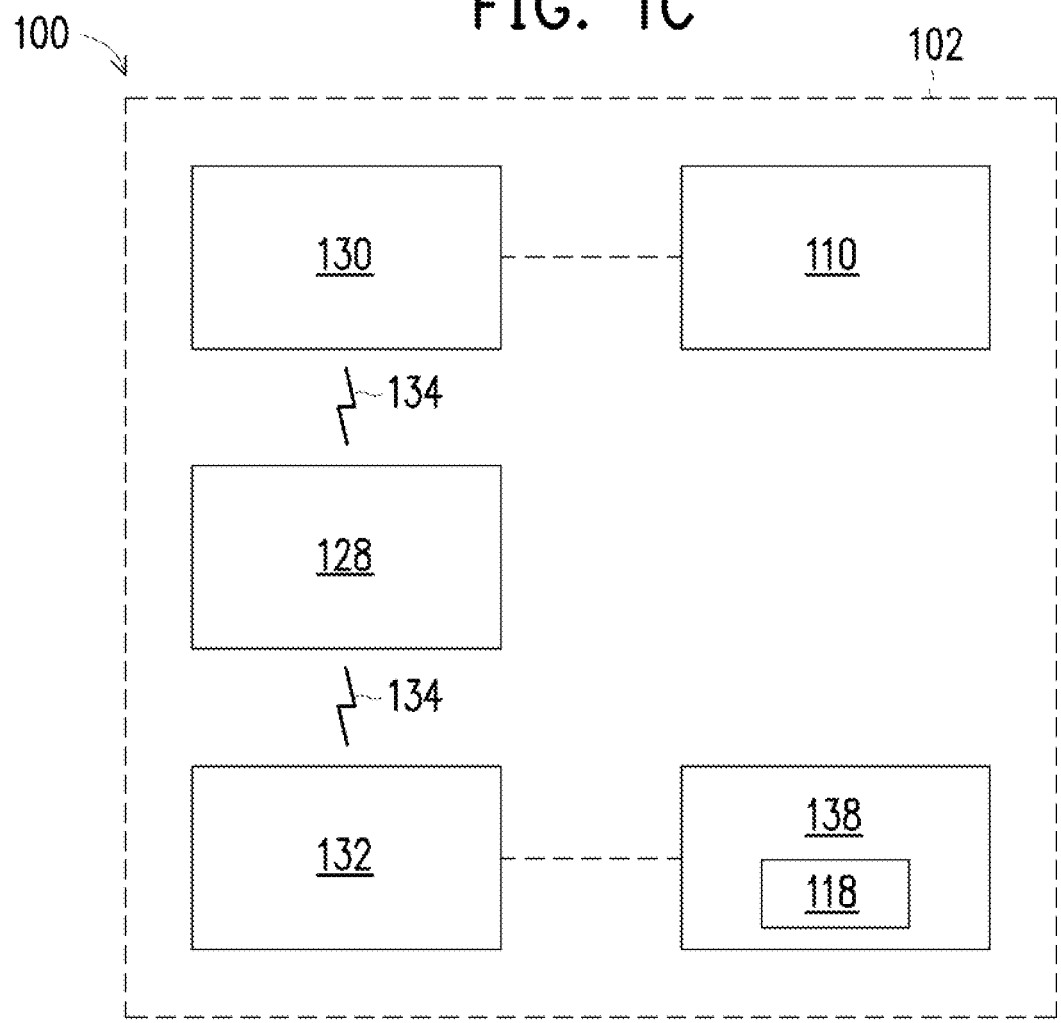

FIG. 1D shows aspects of a control system of the deposition tool 102. In some implementations, the deposition tool 102 includes a controller 128, a gas supply component 130, and/or a power supply component 132. The controller 128 (e.g., a processor, a combination of a processor and memory, among other examples) may communicatively couple to the gas supply component 130 and/or power supply component 132 using one or more communication links 134. The one or more communication links 134 may include or more wireless-communication links, one or more wired-communication links, or a combination of one or more wireless-communication links and one or more wired-communication links, among other examples. In some implementations, the gas supply component 130 includes a pressurized gas supply component and/or a controllable valve to supply a gas to the gas delivery component 110. In some implementations, the power supply component 132 provides power to an electromagnetic circuit 138 including the electrode component 118. As an example, the power supply component 132 may provide a radio frequency (RF) power to energize a chemical vapor from the gas delivery component 110 into a plasma. Additionally, or alternatively, the power supply component 132 may provide a direct current (DC) power to the electrode component 118 to bias the electrode component 118. In some implementations, the controller 128, the gas supply component 130, and/or power supply component 132 are external to the deposition tool 102.

The controller 128 may adjust settings of the gas supply component 130 and/or power supply component 132 using a machine learning model. The machine learning model may include and/or may be associated with one or more of a neural network model, a random forest model, a clustering model, or a regression model. In some implementations, the controller 128 uses the machine learning model to adjust a setting of the gas supply component 130 and/or power supply component 132 by providing candidate deposition parameters as input to the machine learning model, and using the machine learning model to determine a likelihood, probability, or confidence that a particular outcome (e.g., a quality of a deposition of a material between beveled edges of the semiconductor substrate 106a and the semiconductor substrate 106b, among other examples) for a subsequent deposition operation will be achieved using the candidate parameters. In some implementations, the controller 128 provides a quality of the deposition of the material as input to the machine learning model, and the controller 128 uses the machine learning model to determine or identify a particular combination of settings of the gas supply component 130 and/or settings of power supply component 132 that are likely to achieve the quality of the deposition of the material.

The controller 128 (or another system) may train, update, and/or refine the machine learning model to increase the accuracy of the outcomes and/or parameters determined using the machine learning model. The controller 128 may train, update, and/or refine the machine learning model based on feedback and/or results from the subsequent deposition operation, as well as from historical or related deposition operations (e.g., from hundreds, thousands, or more historical or related deposition operations) performed by the deposition tool 102.

As indicated above, FIGS. 1A-1D are provided as examples. Other examples may differ from what is described with regard to FIGS. 1A-1D. For example, another example may include additional components, fewer components, different components, or differently arranged components than those shown in FIGS. 1A-1D. Additionally, or alternatively, a set of components (e.g., one or more components) of FIGS. 1A-1D may perform one or more functions described herein as being performed by another set of components.

Figure 2A:
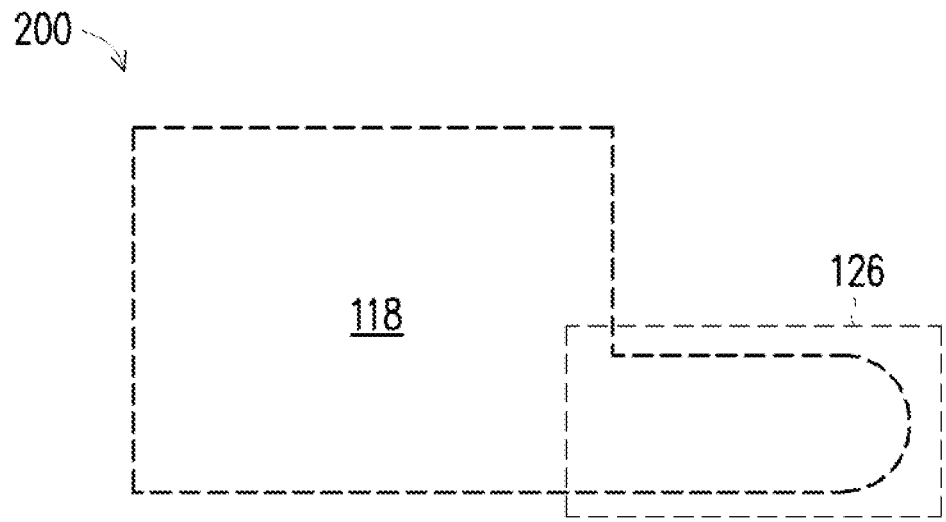
FIGS. 2A-2C are diagrams of example implementations of an electrode used by the deposition tool described herein.
Figure 2B:
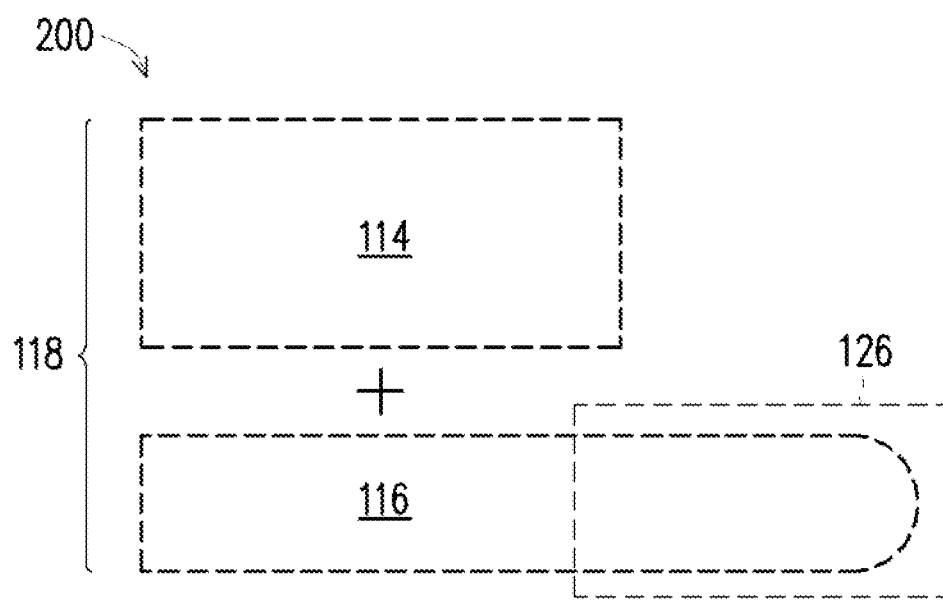
Figure 2C:
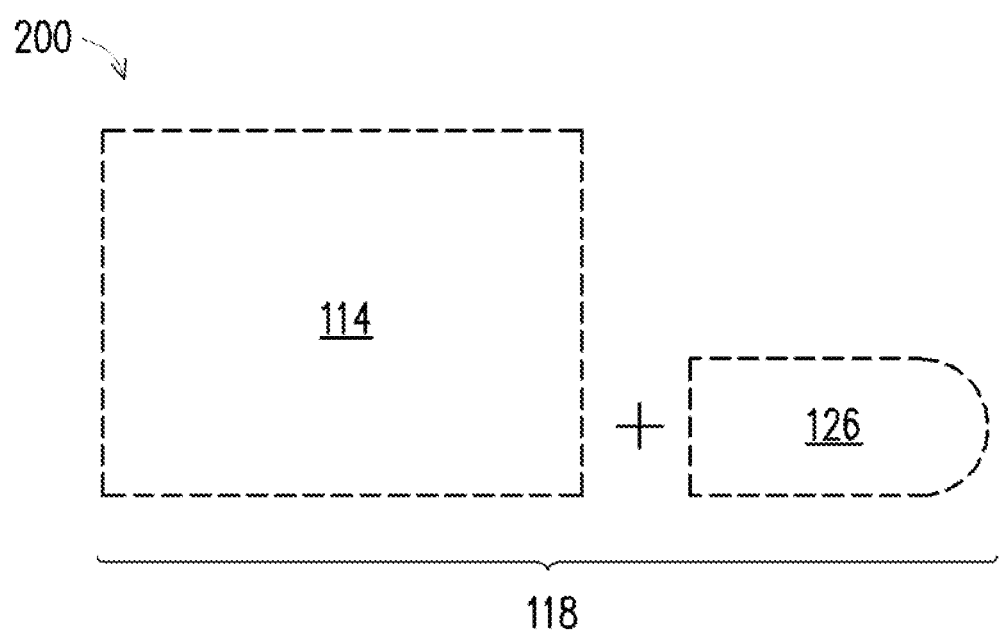

FIGS. 2A-2C are diagrams of example implementations 200 of the electrode component 118 used by the deposition tool 102 described herein. As shown in FIG. 2A, the electrode component 118 including the protrusion 126 are formed from a contiguous material. As an example, the contiguous material may include a conductive metal material such as aluminum (Al), tungsten (W), titanium (Ti), and/or copper (Cu), among other examples. Furthermore, the electrode component 118 and the protrusion 126 may be coated with a material to harden the protrusion 126, such as an aluminum oxide ($Al_2O_3$) material, a yttrium oxide ($Y_2O_3$) material, or a silicon dioxide ($SiO_2$) material, among other examples.

As shown in FIG. 2B, the electrode component 118 includes the extension component 116 (including the protrusion 126) attached to a bottom surface of the top electrode 114. In FIG. 2B, and in contrast to the example shown in FIG. 2A, different combinations of materials and coatings may be included in the top electrode 114 and the extension component 116.

As shown in FIG. 2C, the electrode component 118 includes the protrusion 126 attached to a side surface of the top electrode 114. In FIG. 2C, and in contrast to the example shown in FIG. 2A, different combinations of materials and coatings may be included in the top electrode 114 and the protrusion 126.

As indicated above, FIGS. 2A-2C are provided as examples. Other examples may differ from what is described with regard to FIGS. 2A-2C.

Figure 3A:
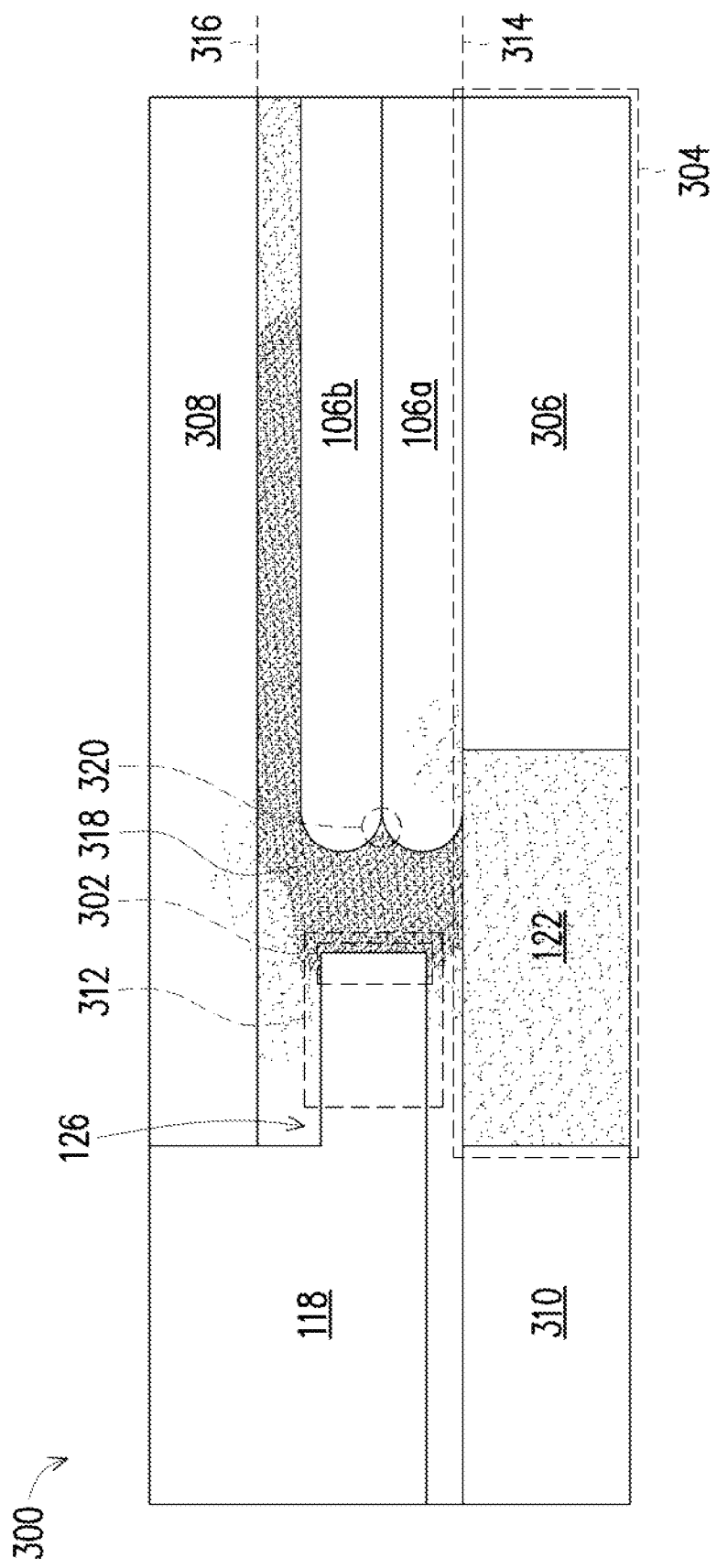
FIGS. 3A and 3B are diagrams of an example implementations described herein.
Figure 3B:
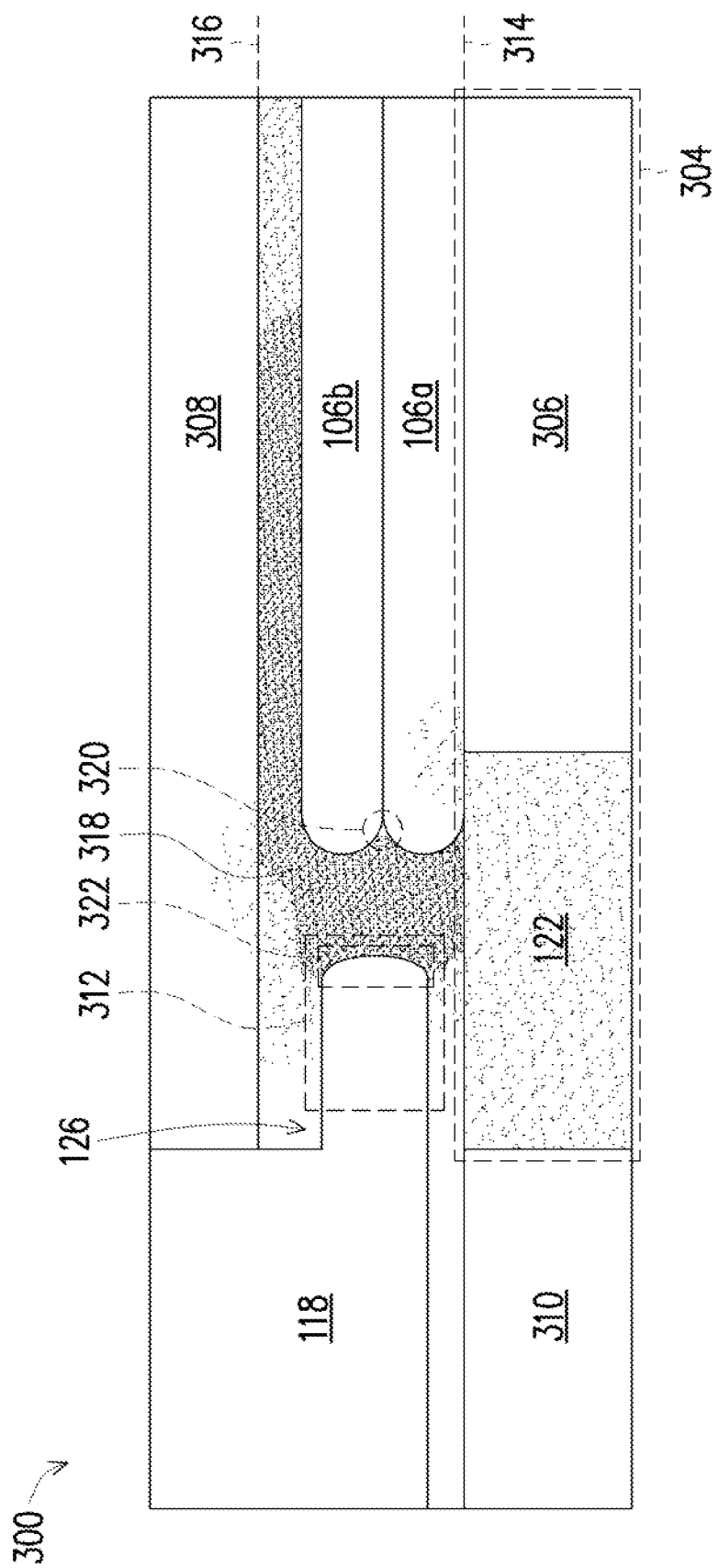

FIGS. 3A and 3B are diagrams of example implementations 300 described herein. The implementations 300 shown in the side views of FIGS. 3A and 3B show different configurations of a deposition tool (e.g., the deposition tool 102) including the electrode component 118.

As shown in FIG. 3A, the protrusion 126 includes an approximately rectangular-shaped tip 302. The semiconductor substrate 106a and the semiconductor substrate 106b are stacked on a semiconductor substrate support component 304. As shown in FIG. 3A, the semiconductor substrate support component 304 includes the insulator component 122 and an electrode component 306. In some implementations, the electrode component 306 corresponds to a bottom electrode configured as an electrical input to an electromagnetic circuit (e.g., the electromagnetic circuit 138 including the top electrode 114 configured as an electrical ground, among other examples). Additionally, or alternatively, the electrode component 306 may be included as part of an electrostatic chuck (ESC), a vacuum chuck, or another type of support component for the semiconductor substrate 106a and the semiconductor substrate 106b.

FIG. 3A further shows an insulator component 308 above the semiconductor substrate support component 304 and an electrode component 310 below the electrode component 118. The electrode component 310 may be separated from the electrode component 118 and be configured as part of the electrical ground of the electromagnetic circuit (e.g., be an electrically parallel ground to the electrical ground of the electrode component 118).

As shown in FIG. 3A, the protrusion 126 extends into a region 312 that is vertically above a top surface 314 of the semiconductor substrate support component 304 and vertically below a bottom surface 316 of the insulator component 308. The electrode component 118 including the protrusion 126 is used as part of generating an approximately lateral electromagnetic field 318 between the approximately rectangular-shaped tip 302 and a region 320 (e.g., a lateral gap) located between beveled edges of the semiconductor substrate 106a and the semiconductor substrate 106b. The approximately lateral electromagnetic field 318 may be used in energizing a gas into a plasma (e.g., a gas flowing from the gas supply component 130 through the gas delivery component the gas delivery component 110) and that is dispersed into the region 320 to form a supporting fill material between the beveled edges of the semiconductor substrate 106a and the semiconductor substrate 106b. In some implementations, the gas corresponds to a chemical vapor that includes chemical elements of the supporting fill material.

As shown in FIG. 3B, the protrusion 126 includes an approximately oval-shaped tip 322. In similar fashion to the configuration described in FIG. 3A, the electrode component 118 including the protrusion 126 is used as part of generating the approximately lateral electromagnetic field 318 between the approximately oval-shaped tip 322 and the region 320 located between beveled edges of the semiconductor substrate 106a and the semiconductor substrate 106b.

In some implementations, and shown in FIGS. 3A and 3B, a deposition tool (e.g., the deposition tool 102) includes the semiconductor substrate support component 304. The deposition tool includes the insulator component 308 that is above the semiconductor substrate support component 304 and that is separated from the semiconductor substrate support component 304 The deposition tool includes the electrode component 118 that is adjacent to the insulator component 308 and includes the protrusion 126, where the protrusion 126 extends into the region 320 vertically above the top surface 314 of the semiconductor substrate support component 304 and vertically below the bottom surface 316 of the insulator component 308, and where the protrusion 126 is configured to generate the approximately lateral electromagnetic field 318 between the protrusion 126 and a stack of two or more semiconductor substrates (e.g., the semiconductor substrate 106a and the semiconductor substrate 106b) positioned on semiconductor substrate support component 304.

In some implementations, and using one or more components of FIGS. 3A and 3B, a deposition tool (e.g., the deposition tool 102) performs a deposition operation. The deposition operation may include receiving a stack of two or more semiconductor substrates (e.g., the semiconductor substrate 106a and the semiconductor substrate 106b) onto the semiconductor substrate support component 304 that is below, and separated from, an insulator component 308. The deposition operation may include generating the approximately lateral electromagnetic field 318 using the electrode component 118 including the protrusion 126 that extends towards the stack of two or more semiconductor substrates, where the protrusion 126 extends into the region 312 vertically above the top surface 314 of the semiconductor substrate support component 304 and vertically below the bottom surface 316 of the insulator component 308, and where the approximately lateral electromagnetic field 318 is between a tip of the protrusion (e.g., the rectangular-shaped tip 302 or the oval-shaped tip 322) and the stack of two or more semiconductor substrates. The deposition operation includes forming a supporting fill material in the region 320 between beveled edges of the stack of two or more semiconductor substrates using the approximately lateral electromagnetic field 318.

In contrast to another deposition tool not including the electrode component 118 and the protrusion 126, the deposition tool of FIGS. 3A and 3B (e.g., the deposition tool 102) may improve a uniformity of the supporting fill material in the region 320 between the beveled edges of the semiconductor substrate 106a and the semiconductor substrate 106b. Such an improvement may reduce a likelihood of damage to a WoW product including the semiconductor substrate 106a and the semiconductor substrate 106b during a subsequent thinning operation (e.g., reduce a likelihood of crack propagation due to vibratory forces, among other examples).

As indicated above, FIGS. 3A and 3B are provided as examples. Other examples may differ from what is described with regard to FIGS. 3A and 3B. For example, another example may include additional components, fewer components, different components, or differently arranged components than those shown in FIGS. 3A and 3B. Additionally, or alternatively, a set of components (e.g., one or more components) of FIGS. 3A and 3B may perform one or more functions described herein as being performed by another set of components.

Figure 4A:
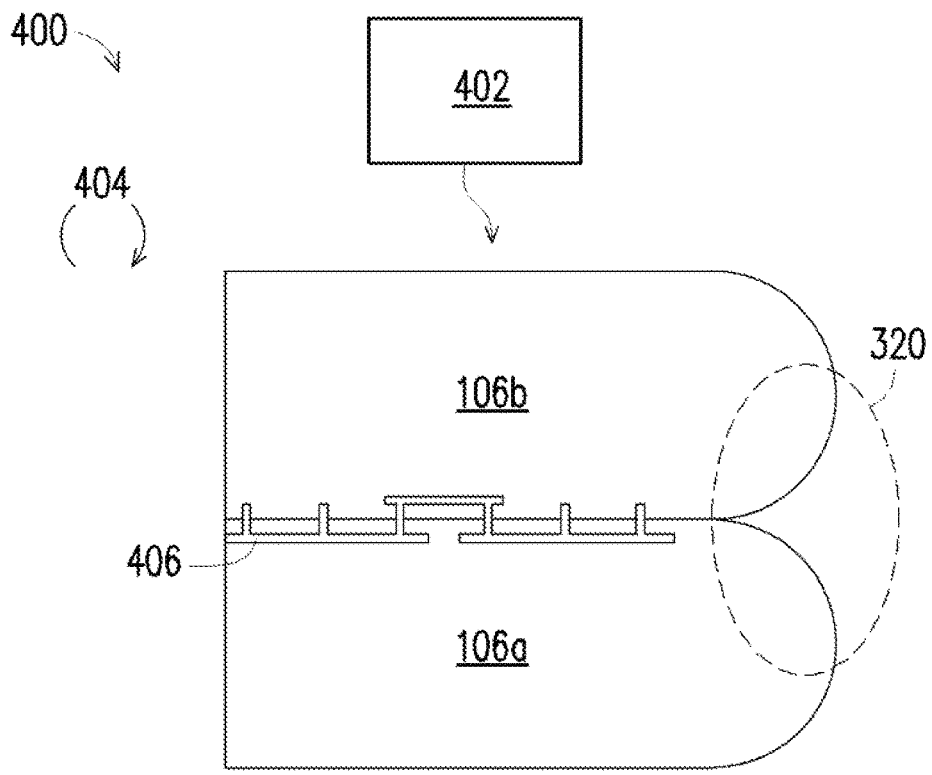
FIGS. 4A-4C are example diagrams of an example manufacturing process using one or more semiconductor processing tools described herein.
Figure 4B:
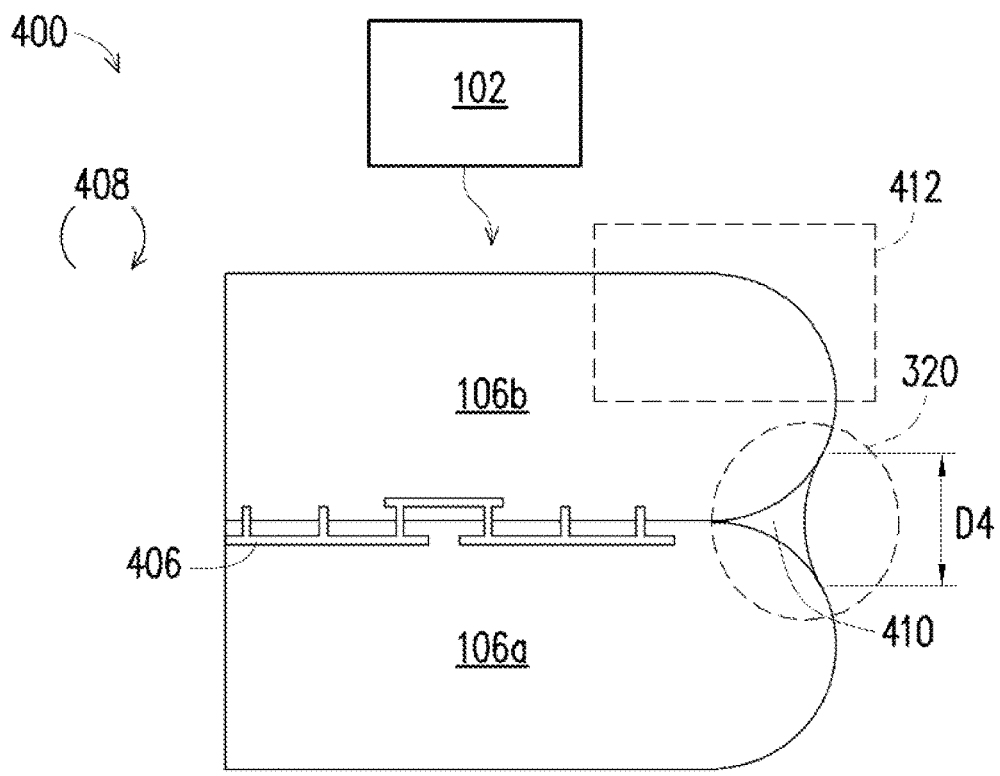
Figure 4C:
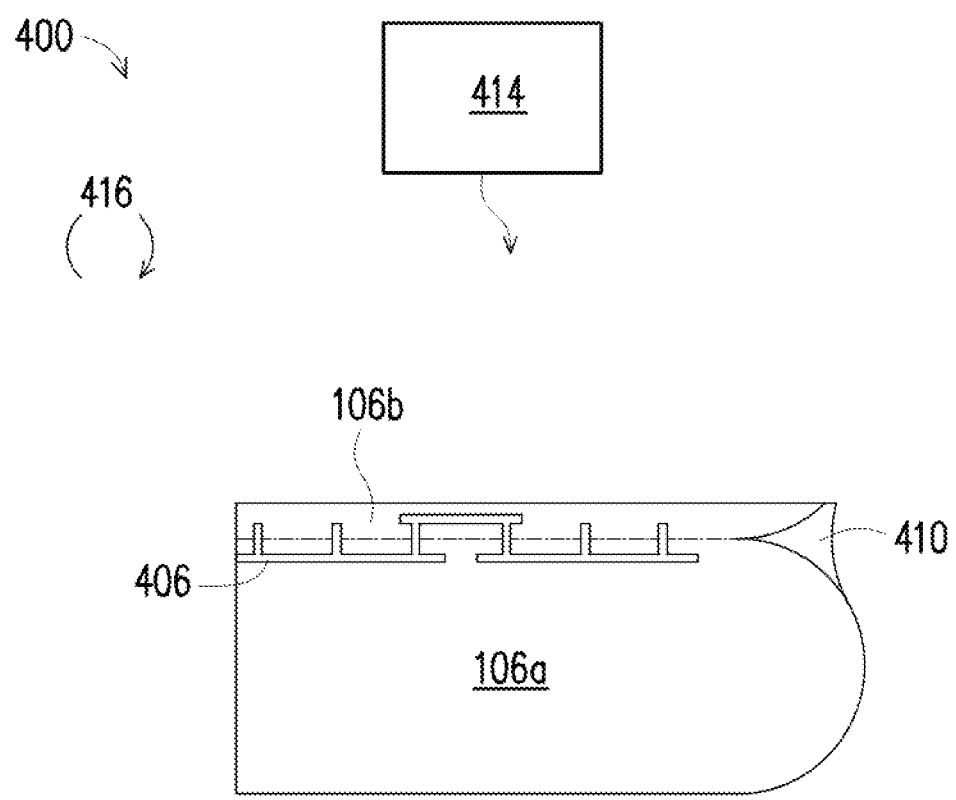

FIGS. 4A-4C are example diagrams of an example manufacturing process 400 using one or more semiconductor processing tools described herein. At least one operation included in the manufacturing process 400 may use the deposition tool 102 of FIGS. 1A-3B. The manufacturing process 400 may be used to fabricate a WoW product including two or more semiconductor substrates.

As shown in FIG. 4A, a bonding tool 402 performs a bonding operation 404 to join the semiconductor substrate 106a and the semiconductor substrate 106b (e.g., form a WoW product or a stack of semiconductor substrates, among other examples). The bonding tool 402 is a semiconductor processing tool that is capable of bonding two or more wafers (or two or more semiconductor substrates, or two or more semiconductor devices) together. For example, the bonding tool 402 may include a eutectic bonding tool that is capable of forming a eutectic bond by heating the semiconductor substrate 106a and the semiconductor substrate 106b form a eutectic system between respective materials 406 (e.g., traces, pads, or lands, among other example) exposed at surfaces of the semiconductor substrate 106a and the semiconductor substrate 106b. After the operation 404, the region 320 is formed between beveled edges of the semiconductor substrate 106a and the semiconductor substrate 106b.

As shown in FIG. 4B, and as part of deposition operation 408, the deposition tool 102 forms a supporting fill material 410 in the region 320. As described in connection with FIGS. 3A and 3B and elsewhere herein, the deposition operation 408 may include the deposition tool 102 using an approximately lateral electromagnetic field (e.g., the approximately lateral electromagnetic field 318) to form a supporting fill material 410 in the region 320.

The supporting fill material 410 may include a silicon oxide ($SiO_x$) material, a silicon nitride ($SiN_y$) material, a silicon carbide ($SiC_z$) material, an amorphous silicon (a-Si) material, a metal oxide material, and/or a metal nitride material, among other examples. Additionally, or alternatively, the supporting fill material 410 may include a thickness D4 that is included in a range of approximately 135 microns to approximately 165 microns (e.g., approximately 62.5 to approximately 82.5 microns per semiconductor substrate). If the thickness D4 is less than approximately 135 microns, structural integrity improvements provided by the supporting fill material 410 (e.g., robustness improvements provided to the WoW product, among other examples) may be insufficient to prevent cracking of the semiconductor substrate 106b during a subsequent thinning operation. If the thickness D4 is greater than approximately 165 microns, an increase in deposition time may be realized. Additionally, or alternatively, if the thickness D4 is greater than approximately 165 microns, the supporting fill material 410 may exceed a perimeter of the semiconductor substrate 106a and/or the semiconductor substrate 106b. However, other values and ranges for the thickness D4 are within the scope of the present disclosure.

Forming the supporting fill material 410 in the region 320 may increase a robustness of the stack of two or more semiconductor substrates including the semiconductor substrate 106a and/or the semiconductor substrate 106b. The increased robustness may obviate the need to form a stress relief in an edge region 412 (e.g., obviate the need to form a "trimmed edge region" in the edge region 412) of the semiconductor substrate 106b to prevent damage during a subsequent thinning operation of the semiconductor substrate 106b.

As shown in FIG. 4C, a planarization tool 414 performs a thinning operation 416 to thin (e.g., reduce a thickness) of the semiconductor substrate 106b. The planarization tool 414 is a semiconductor processing tool that is capable of polishing or planarizing various layers of a wafer or semiconductor device. For example, the planarization tool 414 may include a chemical mechanical planarization (CMP) tool and/or another type of planarization tool that polishes or planarizes a layer or surface of deposited or plated material. The planarization tool 414 may polish or planarize a surface of the semiconductor substrate 106b with a combination of chemical and mechanical forces (e.g., chemical etching and free abrasive polishing). The planarization tool 414 may utilize an abrasive and corrosive chemical slurry in conjunction with a polishing pad and retaining ring (e.g., typically of a greater diameter than the semiconductor device). The polishing pad and the semiconductor substrate 106b may be pressed together by a dynamic polishing head and held in place by the retaining ring. The dynamic polishing head may rotate with different axes of rotation to remove material and even out any irregular topography of the semiconductor device, making the semiconductor device flat or planar.

The manufacturing process 400 of FIGS. 4A-4C (e.g., including the deposition operation 408 performed using the deposition tool 102 including the electrode component 118 and the protrusion 126) may provide one or more advantages relative to another manufacturing operation using another deposition operation (e.g., another deposition operation using another deposition tool not including the electrode component 118 and the protrusion 126). For example, the deposition operation 408 may require less time. Additionally, or alternatively, the thinning operation 416 may include a single grinding and polishing operation, as opposed to multiple grinding and polishing operations needed to form a stress relief near edges of the semiconductor substrate 106b (in other words, additional grinding or polishing operations to form a stress relief in the edge region 412 of FIG. 4B, prior to the thinning operation 416, are excluded). Additionally, or alternatively, a capping of such a stress relief (e.g., an amorphous silicon (a-Si) capping process of the stress relief) is avoided. Such advantages may reduce an amount of resources needed to fabricate a WoW product including the semiconductor substrates 106a and 106b (e.g., reduce an amount of manufacturing tools, reduce an amount of computing resources, and/or a reduce an amount of materials consumed, among other examples).

As shown in FIGS. 4A-4C, one or more semiconductor processing tools perform the manufacturing process 400. The manufacturing process 400 includes the bonding tool 402 performing a bonding operation 404. The bonding operation 404 joins two or more semiconductor substrates (e.g., the semiconductor substrate 106a and the semiconductor substrate 106b) to form a stack of the two or more semiconductor substrates. The manufacturing process 400 includes the deposition tool 102, as part of the deposition operation 408, generating an approximately lateral electromagnetic field (e.g., the approximately lateral electromagnetic field 318) adjacent to the stack of two or more semiconductor substrates. Further, the deposition operation 408 includes the deposition tool 102 forming the supporting fill material 410 in the region 320 between beveled edges of the stack of two or more semiconductor substrates using the approximately lateral electromagnetic field. The manufacturing process 400 further includes the planarization tool 414 thinning a top semiconductor substrate (e.g., the semiconductor substrate 106b) of the stack of two or more semiconductor substrates.

As indicated above, FIGS. 4A-4C are provided as examples. Other examples may differ from what is described with regard to FIGS. 4A-4C. Furthermore, although FIGS. 4A-4C show example operations of the manufacturing process 400, in some implementations, the manufacturing process 400 includes additional operations, fewer operations, different operations, or differently arranged operations than those shown in FIGS. 4A-4C.

FIGS. 5A-5E are diagrams of example simulation data 500 of electromagnetic fields generated by deposition tool 102 including the protrusion 126 described herein. FIGS. 5A-5E include an intensity bar 502 gauging an intensity of an electromagnetic field (e.g., the approximately lateral electromagnetic field 318) for different configurations of the protrusion 126. The intensity of the electromagnetic field represented by the intensity bar 502 within FIGS. 5A-5E may be relative and may represented in volts per meter (V/m) or millivolts per meter (mV/m), amongst other examples.

In the configuration of FIG. 5A, the protrusion 126a includes the approximately rectangular-shaped tip 302 and the thickness D2. As described in connection with FIG. 1C, the thickness D2 may be included in a range of approximately 0.9 millimeters to approximately 1.1 millimeters. As further shown in FIG. 5A, a tip of the protrusion 126a and the region 320 are separated by a distance D5 which may be included in a range of approximately 1.35 millimeters to approximately 1.55 millimeters. For the configuration of FIG. 5A, an intensity of the approximately lateral electromagnetic field 318a is consistent for a majority of the region 320, with an area of reduced intensity 504a in a subregion of the region 320. The distribution of the intensity of the approximately lateral electromagnetic field 318a may be sufficient to form a supporting fill material (e.g., the supporting fill material 410) having a targeted quality between the beveled edges of the semiconductor substrate 106a and the semiconductor substrate 106b.

Figure 5B:
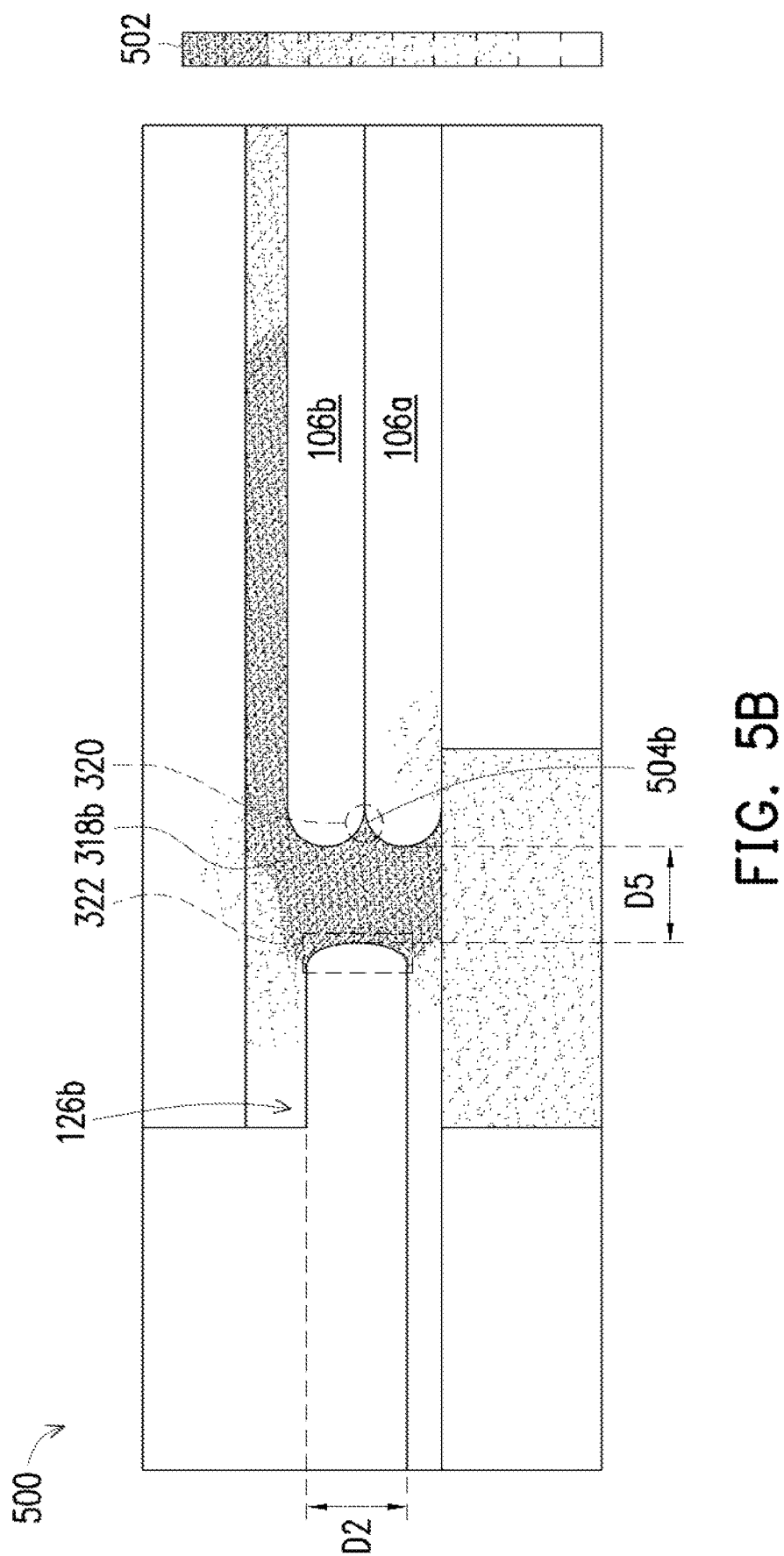

In the configuration of FIG. 5B, the protrusion 126b includes the approximately oval-shaped tip 322 and the thickness D2. As described in connection with FIG. 1C, the thickness D2 may be included in a range of approximately 0.9 millimeters to approximately 1.1 millimeters. As further shown in FIG. 5B, a tip of the protrusion 126b and the region 320 are separated by the distance D5 which may be included in a range of approximately 1.35 millimeters to approximately 1.55 millimeters. For the configuration of FIG. 5B, an intensity of the approximately lateral electromagnetic field 318b is consistent for a majority of the region 320, with an area of reduced intensity 504b in a subregion of the region 320. A distribution of the intensity of the approximately lateral electromagnetic field 318b may be sufficient to form a supporting fill material (e.g., the supporting fill material 410) having a targeted quality between the beveled edges of the semiconductor substrate 106a and the semiconductor substrate 106b.

Figure 5C:
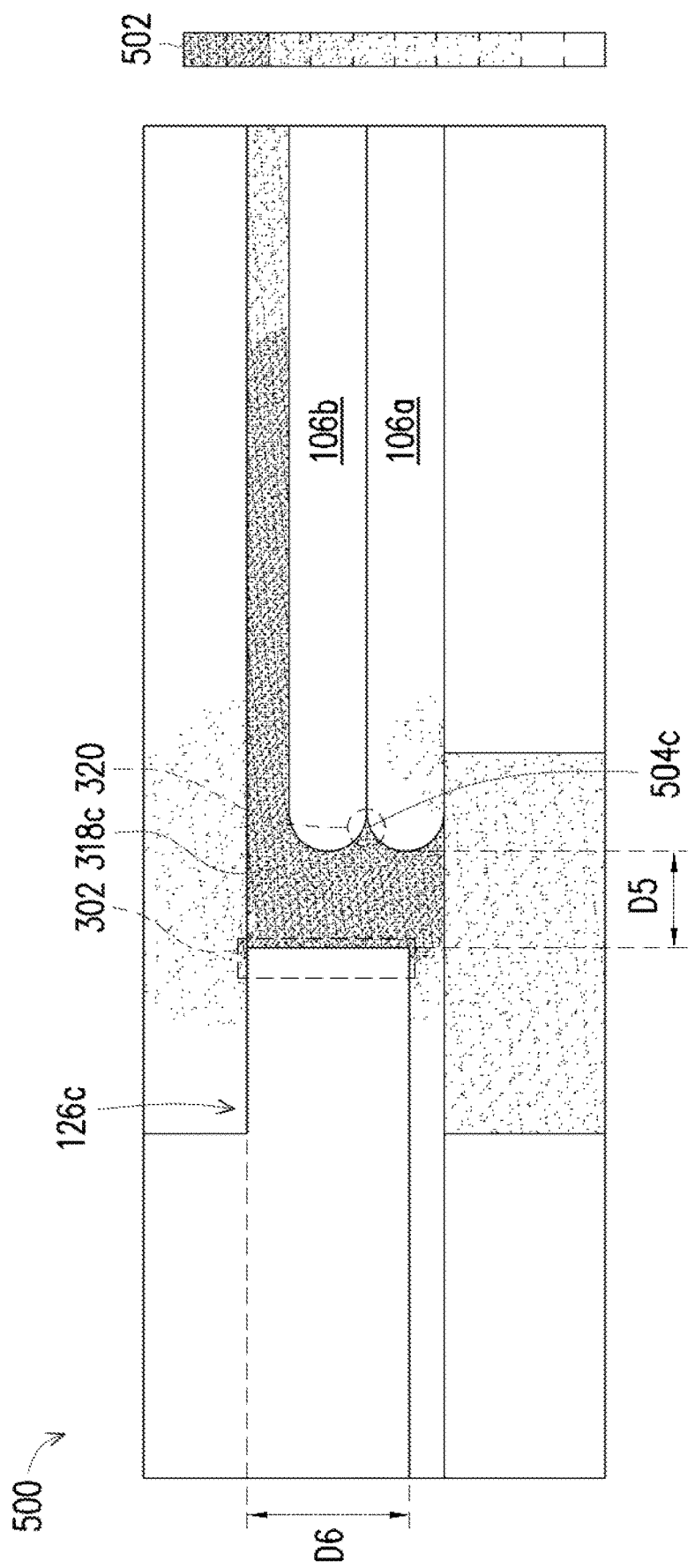

In the configuration of FIG. 5C, the protrusion 126c includes the approximately rectangular-shaped tip 302 and a thickness D6. The thickness D6 may be included in a range of approximately 1.35 millimeters to approximately 1.65 millimeters. As further shown in FIG. 5C, a tip of the protrusion 126c and the region 320 are separated by the distance D5 which may be included in a range of approximately 1.35 millimeters to approximately 1.55 millimeters. For the configuration of FIG. 5C, an intensity of the approximately lateral electromagnetic field 318c is consistent for a majority of the region 320, with an area of reduced intensity 504c in a subregion of the region 320. A distribution of the intensity of the approximately lateral electromagnetic field 318c may be sufficient to form a supporting fill material (e.g., the supporting fill material 410) having a targeted quality between the beveled edges of the semiconductor substrate 106a and the semiconductor substrate 106b.

In the configuration of FIG. 5D, the protrusion 126d includes the approximately rectangular-shaped tip 302 and the thickness D2. As described in connection with FIG. 1C, the thickness D2 may be included in a range of approximately 0.9 millimeters to approximately 1.1 millimeters. As further shown in FIG. 5D, a tip of the protrusion 126d and the region 320 are separated by a distance D7 which may be included in a range of approximately 0.9 millimeters to approximately 1.1 millimeters. For the configuration of FIG. 5D, an intensity of the approximately lateral electromagnetic field 318d is consistent for a majority of the region 320, with an area of reduced intensity 504d in a subregion of the region 320. In some implementations, the area of reduced intensity 504d is lesser relative to the area of reduced intensity 504a of FIG. 5A. A distribution of the intensity of the approximately lateral electromagnetic field 318d may be sufficient to form a supporting fill material (e.g., the supporting fill material 410) having a targeted quality between the beveled edges of the semiconductor substrate 106a and the semiconductor substrate 106b.

Figure 5E:
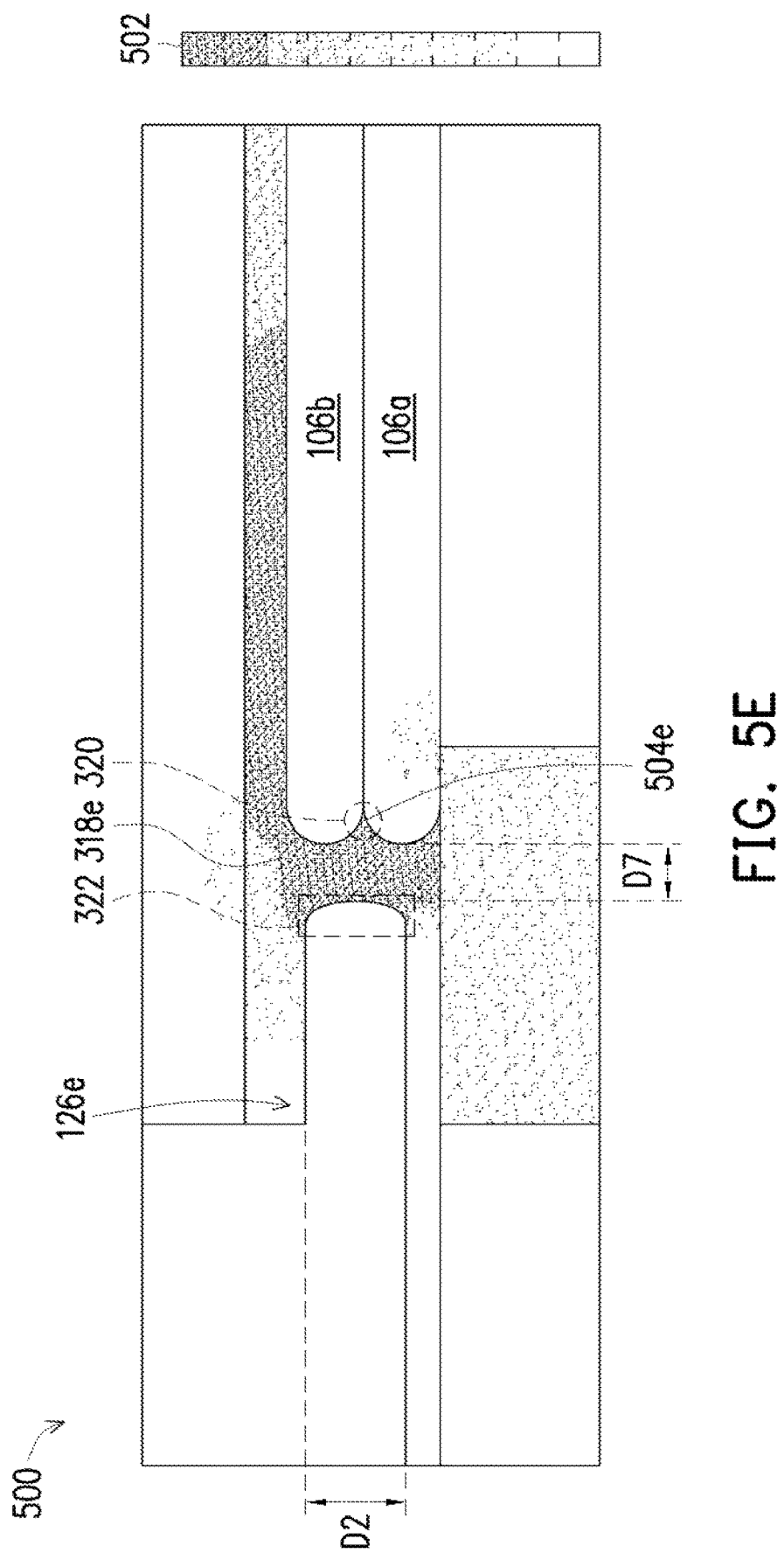

In the configuration of FIG. 5E, the protrusion 126e includes the approximately oval-shaped tip 322 and the thickness D2. As described in connection with FIG. 1C, the thickness D2 may be included in a range of approximately 0.9 millimeters to approximately 1.1 millimeters. As further shown in FIG. 5E, a tip of the protrusion 126e and the region 320 are separated by a distance D7 which may be included in a range of approximately 0.9 millimeters to approximately 1.1 millimeters. For the configuration of FIG. 5E, an intensity of the approximately lateral electromagnetic field 318e is consistent for a majority of the region 320, with an area of reduced intensity 504e in a subregion of the region 320. In some implementations, the area of reduced intensity 504e is lesser relative to the area or reduced intensity 504b of FIG. 5B. A distribution of the intensity of the approximately lateral electromagnetic field 318e may be sufficient to form a supporting fill material (e.g., the supporting fill material 410) having a targeted quality between the beveled edges of the semiconductor substrate 106a and the semiconductor substrate 106b.

As indicated above, FIGS. 5A-5E are provided as examples. Other examples may differ from what is described with regard to FIGS. 5A-5E. In particular, values and ranges for the dimensions D2-D7, as well distributions of intensities for the electromagnetic fields 318a-318e, are provided as examples. Other values and ranges for the dimensions D2-D7, and the distributions of the intensities for the electromagnetic fields 318a-318e, are within the scope of the present disclosure.

Figure 6:
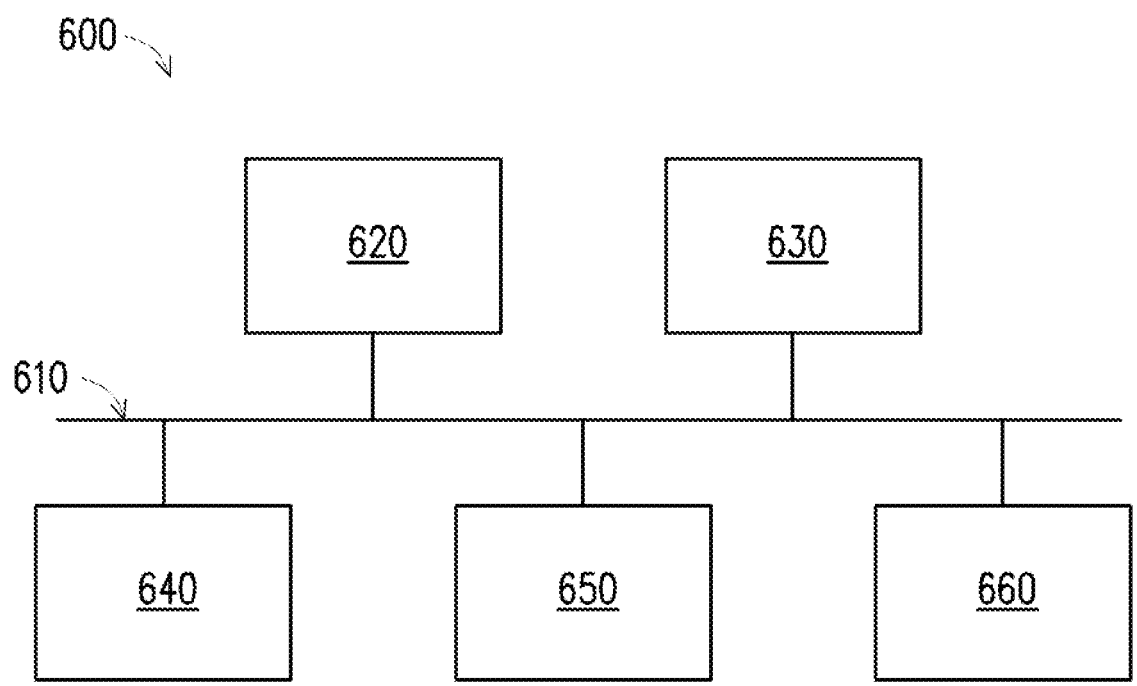
FIG. 6 is a diagram of example components of a device associated with one or more semiconductor processing tools of FIGS. 1A-1D and FIGS. 4A-4C described herein.

FIG. 6 is a diagram of example components of a device 600 associated with one or more semiconductor processing tools of FIGS. 1A-1D and FIGS. 4A-4C described herein. Device 600 may correspond to the deposition tool 102, the controller 128, the bonding tool 402, and/or the planarization tool 414. In some implementations, the deposition tool 102, the controller 128, the bonding tool 402, and/or the planarization tool 414 may include one or more devices 600 and/or one or more components of device 600. As shown in FIG. 6, device 600 may include a bus 610, a processor 620, a memory 630, an input component 640, an output component 650, and a communication component 660.

Bus 610 may include one or more components that enable wired and/or wireless communication among the components of device 600. Bus 610 may couple together two or more components of FIG. 6, such as via operative coupling, communicative coupling, electronic coupling, and/or electric coupling. Processor 620 may include a central processing unit, a graphics processing unit, a microprocessor, a controller, a microcontroller, a digital signal processor, a field-programmable gate array, an application-specific integrated circuit, and/or another type of processing component. Processor 620 is implemented in hardware, firmware, or a combination of hardware and software. In some implementations, processor 620 may include one or more processors capable of being programmed to perform one or more operations or processes described elsewhere herein.

Memory 630 may include volatile and/or nonvolatile memory. For example, memory 630 may include random access memory (RAM), read only memory (ROM), a hard disk drive, and/or another type of memory (e.g., a flash memory, a magnetic memory, and/or an optical memory). Memory 630 may include internal memory (e.g., RAM, ROM, or a hard disk drive) and/or removable memory (e.g., removable via a universal serial bus connection). Memory 630 may be a non-transitory computer-readable medium. Memory 630 stores information, instructions, and/or software (e.g., one or more software applications) related to the operation of device 600. In some implementations, memory 630 may include one or more memories that are coupled to one or more processors (e.g., processor 620), such as via bus 610.

Input component 640 enables device 600 to receive input, such as user input and/or sensed input. For example, input component 640 may include a touch screen, a keyboard, a keypad, a mouse, a button, a microphone, a switch, a sensor, a global positioning system sensor, an accelerometer, a gyroscope, and/or an actuator. Output component 650 enables device 600 to provide output, such as via a display, a speaker, and/or a light-emitting diode. Communication component 660 enables device 600 to communicate with other devices via a wired connection and/or a wireless connection. For example, communication component 660 may include a receiver, a transmitter, a transceiver, a modem, a network interface card, and/or an antenna.

Device 600 may perform one or more operations or processes described herein. For example, a non-transitory computer-readable medium (e.g., memory 630) may store a set of instructions (e.g., one or more instructions or code) for execution by processor 620. Processor 620 may execute the set of instructions to perform one or more operations or processes described herein. In some implementations, execution of the set of instructions, by one or more processors 620, causes the one or more processors 620 and/or the device 600 to perform one or more operations or processes described herein. In some implementations, hardwired circuitry is used instead of or in combination with the instructions to perform one or more operations or processes described herein. Additionally, or alternatively, processor 620 may be configured to perform one or more operations or processes described herein. Thus, implementations described herein are not limited to any specific combination of hardware circuitry and software.

The number and arrangement of components shown in FIG. 6 are provided as an example. Device 600 may include additional components, fewer components, different components, or differently arranged components than those shown in FIG. 6. Additionally, or alternatively, a set of components (e.g., one or more components) of device 600 may perform one or more functions described as being performed by another set of components of device 600.

Figure 7:
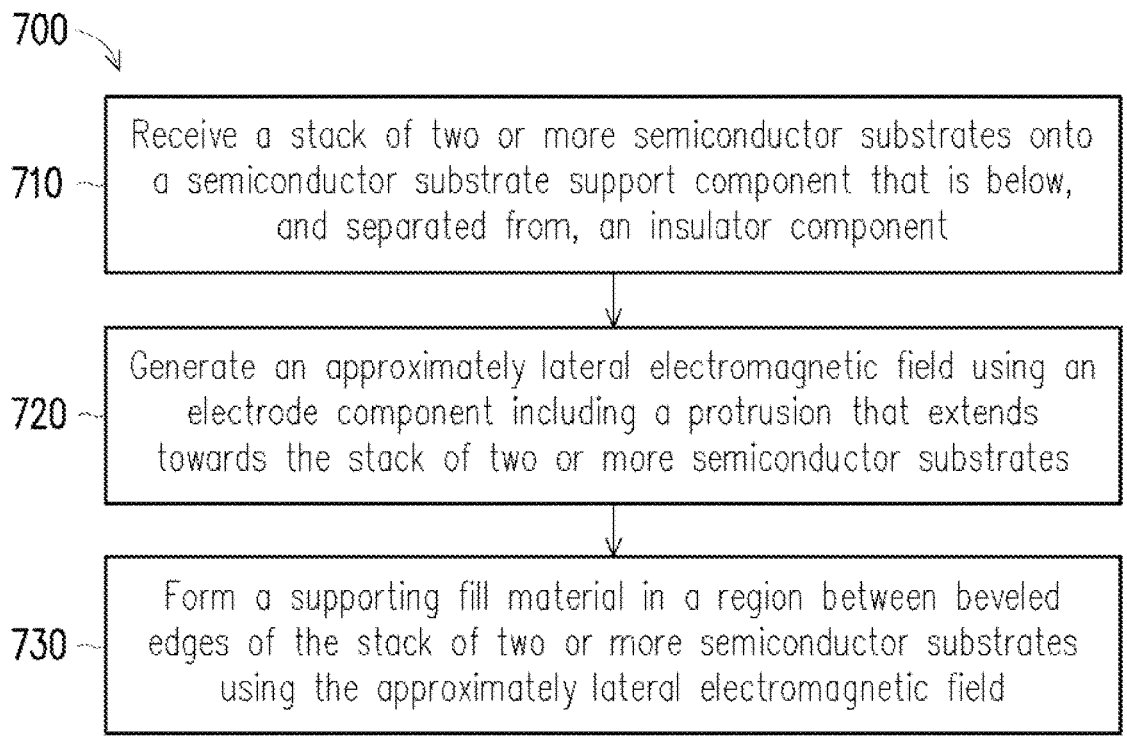
FIGS. 7 and 8 are flowcharts of example processes associated with one or more semiconductor processing tools described herein.

FIG. 7 is a flowchart of an example process 700 associated with one or more semiconductor processing tools described herein. In some implementations, one or more process blocks of FIG. 7 are performed by a deposition tool (e.g., the deposition tool 102). In some implementations, one or more process blocks of FIG. 7 are performed by another device or a group of devices separate from or including the deposition tool 102, such as the controller 128. Additionally, or alternatively, one or more process blocks of FIG. 7 may be performed by one or more components of device 600, such as processor 620, memory 630, input component 640, output component 650, and/or communication component 660.

As shown in FIG. 7, process 700 may include receiving a stack of two or more semiconductor substrates onto a semiconductor substrate support component that is below, and separated from, an insulator component (block 710). For example, the deposition tool 102 may receive a stack of two or more semiconductor substrates (e.g., the semiconductor substrate 106b on the semiconductor substrate 106a) onto a semiconductor substrate support component 304 that is below, and separated from, an insulator component 308, as described above.

As further shown in FIG. 7, process 700 may include generating an approximately lateral electromagnetic field using an electrode component including a protrusion that extends towards the stack of two or more semiconductor substrates (block 720). For example, the deposition tool 102 may generate an approximately lateral electromagnetic field 318 using an electrode component 118 including a protrusion 126 that extends towards the stack of two or more semiconductor substrates, as described above. In some implementations, the protrusion 126 extends into a region 312 vertically above a top surface 314 of the semiconductor substrate support component 304 and vertically below a bottom surface 316 of the insulator component 308. In some implementations, the approximately lateral electromagnetic field 318 is between a tip of the protrusion 126 and the stack of two or more semiconductor substrates.

As further shown in FIG. 7, process 700 may include forming a supporting fill material in a region between beveled edges of the stack of two or more semiconductor substrates using the approximately lateral electromagnetic field (block 730). For example, the deposition tool 102 may form a supporting fill material 410 in a region 320 between beveled edges of the stack of two or more semiconductor substrates using the approximately lateral electromagnetic field 318, as described above.

Process 700 may include additional implementations, such as any single implementation or any combination of implementations described below and/or in connection with one or more other processes described elsewhere herein.

In a first implementation, generating the approximately lateral electromagnetic field comprises the protrusion 126 performing as an electrical ground of an electromagnetic circuit 138.

In a second implementation, alone or in combination with the first implementation, generating the approximately lateral electromagnetic field 318 includes adjusting a setting of a power supply component 132 providing power to generate the approximately lateral electromagnetic field 318 based on a machine learning model.

In a third implementation, alone or in combination with one or more of the first and second implementations, forming the supporting fill material 410 in the region 320 between the beveled edges of the stack of two or more semiconductor substrates using the approximately lateral electromagnetic field 318 includes dispersing a plasma into the region 320 that is between the beveled edges of the stack of two or more semiconductor substrates, where the plasma originates from a chemical vapor including chemical elements of the supporting fill material 410.

In a fourth implementation, alone or in combination with one or more of the first through third implementations, forming the supporting fill material 410 between the beveled edges of the stack of two or more semiconductor substrates using the approximately lateral electromagnetic field 318 includes adjusting a setting of a gas supply component 130 providing the chemical vapor based on a setting of a power supply component 132 providing power to generate the approximately lateral electromagnetic field 318.

Although FIG. 7 shows example blocks of process 700, in some implementations, process 700 includes additional blocks, fewer blocks, different blocks, or differently arranged blocks than those depicted in FIG. 7. Additionally, or alternatively, two or more of the blocks of process 700 may be performed in parallel.

Figure 8:
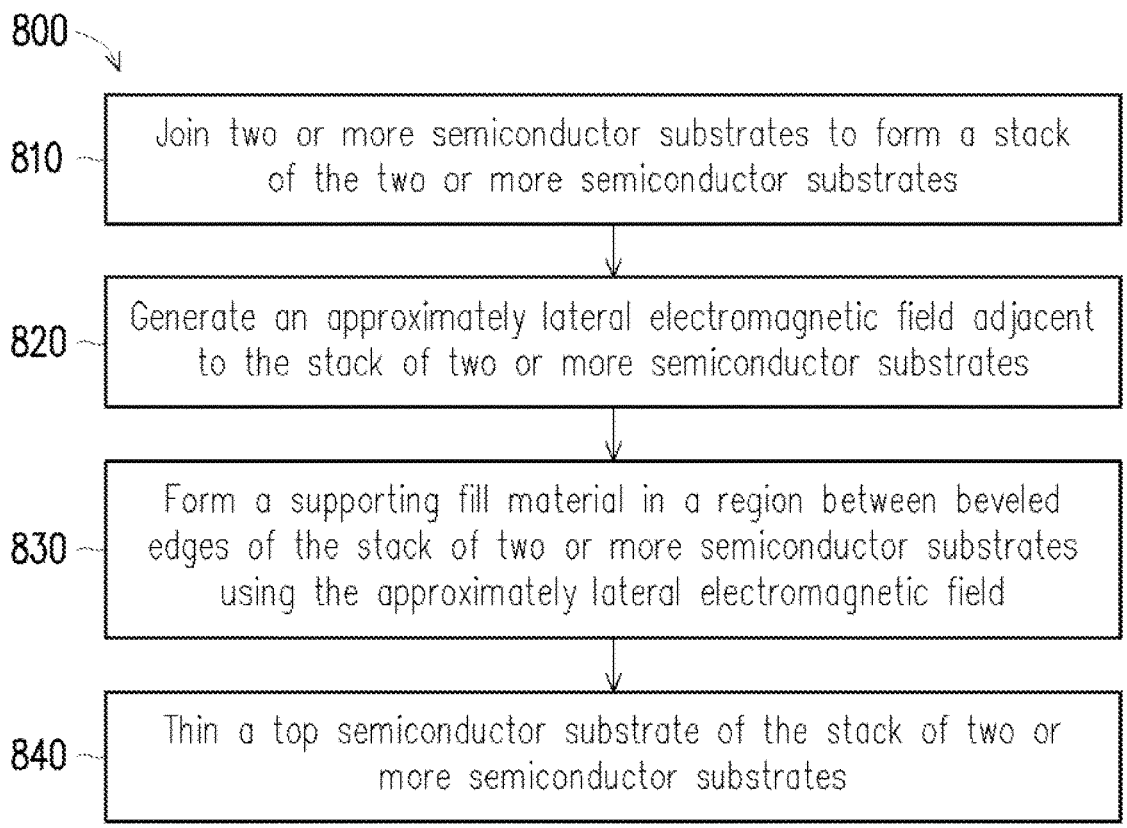

FIG. 8 is a flowchart of an example process 800 associated one or more semiconductor processing tools described herein. In some implementations, one or more process blocks of FIG. 8 are performed by a deposition tool (e.g., the deposition tool 102). In some implementations, one or more process blocks of FIG. 8 are performed by another device or a group of devices separate from or including the deposition tool 102, such as the controller 128, the bonding tool 402, and/or the and the planarization tool 414. Additionally, or alternatively, one or more process blocks of FIG. 8 may be performed by one or more components of device 600, such as processor 620, memory 630, input component 640, output component 650, and/or communication component 660.

As shown in FIG. 8, process 800 may include joining two or more semiconductor substrates to form a stack of the two or more semiconductor substrates (block 810). For example, the bonding tool 402 may join two or more semiconductor substrates (e.g., the semiconductor substrate 106a and the semiconductor substrate 106b) to form a stack of the two or more semiconductor substrates, as described above.

As further shown in FIG. 8, process 800 may include generating an approximately lateral electromagnetic field adjacent to the stack of two or more semiconductor substrates (block 820). For example, the deposition tool 102 may generate an approximately lateral electromagnetic field 318 adjacent to the stack of two or more semiconductor substrates, as described above.

As further shown in FIG. 8, process 800 may include forming a supporting fill material in a region between beveled edges of the stack of two or more semiconductor substrates using the approximately lateral electromagnetic field (block 830). For example, the deposition tool 102 may form a supporting fill material 410 in a region 320 between beveled edges of the stack of two or more semiconductor substrates using the approximately lateral electromagnetic field 318, as described above.

As further shown in FIG. 8, process 800 may include thinning a top semiconductor substrate of the stack of two or more semiconductor substrates (block 840). For example, the planarization tool 414 may thin a top semiconductor substrate (e.g., the semiconductor substrate 106*b*) of the stack of two or more semiconductor substrates, as described above.

Process 800 may include additional implementations, such as any single implementation or any combination of implementations described below and/or in connection with one or more other processes described elsewhere herein.

In a first implementation, generating the approximately lateral electromagnetic field includes providing power to an electromagnetic circuit 138 that includes an electrode component 118 adjacent to the stack of two or more semiconductor substrates, where the electrode component 118 includes a protrusion 126 extending towards the region 320 between the beveled edges of the stack of two or more semiconductor substrates, and where the electrode component 118 is configured as an electrical ground of the electromagnetic circuit 138.

In a second implementation, alone or in combination with the first implementation, generating the approximately lateral electromagnetic field 318 includes generating the approximately lateral electromagnetic field 318 using an electrode component including a protrusion 126 that has an approximately oval-shaped tip 322 adjacent to the stack of two or more semiconductor substrates.

In a third implementation, alone or in combination with one or more of the first and second implementations, generating the approximately lateral electromagnetic field 318 includes generating the approximately lateral electromagnetic field 318 using an electrode component 118 including a protrusion 126 that has an approximately rectangular-shaped tip 302 adjacent to the stack of two or more semiconductor substrates.

In a fourth implementation, alone or in combination with one or more of the first through third implementations, thinning the top semiconductor substrate includes thinning a top semiconductor substrate that excludes a trimmed edge region 412.

In a fifth implementation, alone or in combination with one or more of the first through fourth implementations, thinning the top semiconductor substrate includes thinning the top semiconductor substrate using a single grinding operation and a single chemical-mechanical planarization operation after forming the supporting fill material 410.

Although FIG. 8 shows example blocks of process 800, in some implementations, process 800 includes additional blocks, fewer blocks, different blocks, or differently arranged blocks than those depicted in FIG. 8. Additionally, or alternatively, two or more of the blocks of process 800 may be performed in parallel.

Some implementations described herein include systems and techniques for fabricating a WoW product using a filled lateral gap between beveled regions of wafers included in a stacked-wafer assembly and along a perimeter region of the stacked-wafer assembly. The systems and techniques include a deposition tool having an electrode with a protrusion that enhances an electromagnetic field along the perimeter region of the stacked-wafer assembly during a deposition operation performed by the deposition tool. Relative to an electromagnetic field generated by a deposition tool not including the electrode with the protrusion, the enhanced electromagnetic field improves the deposition operation so that a supporting fill material may be sufficiently deposited between the beveled regions to improve a robustness of the stacked-wafer assembly.

In this way, the supporting fill material enables a WoW product to be formed with fewer manufacturing steps and/or fewer defects relative to a similar product that is formed using techniques that do not include using the supporting fill material. As such, an increase in manufacturing efficiencies may be realized through a reduction in resources needed to fabricate a volume of the WoW product (e.g., a reduction in manufacturing tools, a reduction in computing resources, and/or a reduction in materials consumed, among other examples). Additionally, or alternatively, a likelihood of defects that reduce a yield during manufacturing and/or cause latent failures of the WoW product during field use may be reduced to improve an overall quality and/or reliability of the WoW product.

As described in greater detail above, some implementations described herein provide a deposition tool. The deposition tool includes a semiconductor substrate support component. The deposition tool includes an insulator component that is above the semiconductor substrate support component and that is separated from the semiconductor substrate support component. The deposition tool includes an electrode component that is adjacent to the insulator component and includes a protrusion, where the protrusion extends into a region vertically above a top surface of the semiconductor substrate support component and vertically below a bottom surface of the insulator component, and where the protrusion is configured to generate an approximately lateral electromagnetic field between the protrusion and a stack of two or more semiconductor substrates positioned on the semiconductor substrate support component.

As described in greater detail above, some implementations described herein provide a method. The method includes receiving a stack of two or more semiconductor substrates onto a semiconductor substrate support component that is below, and separated from, an insulator component. The method includes generating an approximately lateral electromagnetic field using an electrode component including a protrusion that extends towards the stack of two or more semiconductor substrates, where the protrusion extends into a region vertically above a top surface of the semiconductor substrate support component and vertically below a bottom surface of the insulator component, and where the approximately lateral electromagnetic field is between a tip of the protrusion and the stack of two or more semiconductor substrates. The method includes forming a supporting fill material in a region between beveled edges of the stack of two or more semiconductor substrates using the approximately lateral electromagnetic field.

As described in greater detail above, some implementations described herein provide a method. The method includes joining two or more semiconductor substrates to form a stack of the two or more semiconductor substrates. The method includes generating an approximately lateral electromagnetic field adjacent to the stack of two or more semiconductor substrates. The method includes forming a supporting fill material in a region between beveled edges of the stack of two or more semiconductor substrates using the approximately lateral electromagnetic field. The method includes thinning a top semiconductor substrate of the stack of two or more semiconductor substrates.

As used herein, the term "and/or," when used in connection with a plurality of items, is intended to cover each of the plurality of items alone and any and all combinations of the plurality of items. For example, "A and/or B" covers "A and B," "A and not B," and "B and not A."

As used herein, "satisfying a threshold" may, depending on the context, refer to a value being greater than the threshold, greater than or equal to the threshold, less than the threshold, less than or equal to the threshold, equal to the threshold, not equal to the threshold, or the like.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    receiving a stack of two or more semiconductor substrates onto a semiconductor substrate support component that is below, and separated from, an insulator component,
    generating an approximately lateral electromagnetic field using an electrode component including a protrusion that extends towards the stack of two or more semiconductor substrates,
        wherein the protrusion extends into a region vertically above a top surface of the semiconductor substrate support component and vertically below a bottom surface of the insulator component, and
        wherein the approximately lateral electromagnetic field is between a tip of the protrusion and the stack of two or more semiconductor substrates; and
    forming a supporting fill material in a region between beveled edges of the stack of two or more semiconductor substrates using the approximately lateral electromagnetic field.

2. The method of claim 1, wherein generating the approximately lateral electromagnetic field comprises:
    the protrusion performing as an electrical ground of an electromagnetic circuit.

3. The method of claim 1, wherein generating the approximately lateral electromagnetic field comprises:
    adjusting a setting of a power supply component providing power to generate the approximately lateral electromagnetic field based on a machine learning model.

4. The method of claim 1, wherein forming the supporting fill material in the region between the beveled edges of the stack of two or more semiconductor substrates using the approximately lateral electromagnetic field comprises:
    dispersing a plasma into the region that is between the beveled edges of the stack of two or more semiconductor substrates,
        wherein the plasma originates from a chemical vapor including chemical elements of the supporting fill material.

5. The method of claim 4, wherein forming the supporting fill material between the beveled edges of the stack of two or more semiconductor substrates using the approximately lateral electromagnetic field comprises:
    adjusting a setting of a gas supply component providing the chemical vapor based on a setting of a power supply component providing power to generate the approximately lateral electromagnetic field.

6. A method, comprising:
    joining two or more semiconductor substrates to form a stack of the two or more semiconductor substrates;
    generating an approximately lateral electromagnetic field adjacent to the stack of two or more semiconductor substrates;
    forming a supporting fill material in a region between beveled edges of the stack of two or more semiconductor substrates using the approximately lateral electromagnetic field; and
    thinning a top semiconductor substrate of the stack of two or more semiconductor substrates.

7. The method of claim 6, wherein generating the approximately lateral electromagnetic field comprises:
    providing power to an electromagnetic circuit that includes an electrode component adjacent to the stack of two or more semiconductor substrates,
        wherein the electrode component includes a protrusion extending towards the region between the beveled edges of the stack of two or more semiconductor substrates, and
        wherein the electrode component is configured as an electrical ground of the electromagnetic circuit.

8. The method of claim 6, wherein generating the approximately lateral electromagnetic field comprises:
    generating the approximately lateral electromagnetic field using an electrode component including a protrusion that has an approximately oval-shaped tip adjacent to the stack of two or more semiconductor substrates.

9. The method of claim 6, wherein generating the approximately lateral electromagnetic field comprises:
    generating the approximately lateral electromagnetic field using an electrode component including a protrusion that has an approximately rectangular-shaped tip adjacent to the stack of two or more semiconductor substrates.

10. The method of claim 6, wherein thinning the top semiconductor substrate comprises:
    thinning a top semiconductor substrate that excludes a trimmed edge region.

11. The method of claim 6, wherein thinning the top semiconductor substrate comprises:
    thinning the top semiconductor substrate using a single grinding operation and a single chemical-mechanical planarization operation after forming the supporting fill material.

12. A method, comprising:
    receiving a stack of two or more semiconductor substrates onto a semiconductor substrate support component;
    generating an approximately lateral electromagnetic field using an electrode component including a protrusion that extends towards the stack of two or more semiconductor substrates; and
    forming a supporting fill material in a region between beveled edges of the stack of two or more semiconductor substrates using the approximately lateral electromagnetic field.

13. The method of claim 12, wherein the protrusion comprises:
    an approximately rectangular-shaped tip at an end of the protrusion extending into the region.

14. The method of claim 12, wherein the protrusion comprises:
    an approximately oval-shaped tip at an end of the protrusion extending into the region.

15. The method of claim 12, wherein the electrode component corresponds to a ring-shaped electrode component, and
    wherein the protrusion extends radially towards a central location above a top surface of the semiconductor substrate support component and below a bottom surface of an insulator component.

16. The method of claim 12, wherein the electrode component comprises:
a disc-shaped ground component to which an extension component including the protrusion is attached.

17. The method of claim 12, wherein the electrode component comprises:
a contiguous material, and
wherein the protrusion is included as part of the contiguous material.

18. The method of claim 12, wherein the electrode component corresponds to a first electrode component configured as part of an electrical ground of an electromagnetic circuit, and
wherein the semiconductor substrate support component includes a second electrode component configured as an electrical input of the electromagnetic circuit.

19. The method of claim 18, further comprising:
Forming a third electrode component below the first electrode component,
wherein the third electrode component is configured as part of the electrical ground of the electromagnetic circuit.

20. The method of claim 12, wherein the protrusion is coated with a yttrium oxide material.

* * * * *